United States Patent
Seki

(10) Patent No.: US 7,535,013 B2
(45) Date of Patent: May 19, 2009

(54) EXTREME UV RADIATION EXPOSURE TOOL AND EXTREME UV RADIATION SOURCE DEVICE

(75) Inventor: Kyohei Seki, Himeji (JP)

(73) Assignee: Ushiodenki Kabushiki Kaisha, Tokyo (JP)

( * ) Notice: Subject to any disclaimer, the term of this patent is extended or adjusted under 35 U.S.C. 154(b) by 248 days.

(21) Appl. No.: 11/412,793

(22) Filed: Apr. 28, 2006

(65) Prior Publication Data

US 2006/0243923 A1    Nov. 2, 2006

(30) Foreign Application Priority Data

Apr. 28, 2005   (JP) .............................. 2005-130925

(51) Int. Cl.
*G21K 3/00*       (2006.01)
(52) U.S. Cl. .............. 250/492.2; 250/492.1; 250/504 R
(58) Field of Classification Search .............. 250/492.2, 250/492.1, 504 R; 378/34, 35; 355/71; 430/311
See application file for complete search history.

(56) References Cited

U.S. PATENT DOCUMENTS

| | | | | |
|---|---|---|---|---|
| 5,597,670 | A * | 1/1997 | Aketagawa et al. | 430/30 |
| 5,661,547 | A * | 8/1997 | Aketagawa et al. | 355/53 |
| 5,848,119 | A * | 12/1998 | Miyake et al. | 378/34 |
| 6,359,969 | B1 | 3/2002 | Shmaenok | |
| 6,469,827 | B1 * | 10/2002 | Sweatt et al. | 359/351 |
| 6,836,530 | B2 * | 12/2004 | Singer et al. | 378/34 |
| 6,927,403 | B2 * | 8/2005 | Singer et al. | 250/461.1 |
| 7,145,632 | B2 * | 12/2006 | Hara et al. | 355/30 |
| 7,248,667 | B2 * | 7/2007 | Weiss et al. | 378/34 |
| 7,319,509 | B2 * | 1/2008 | Singer | 355/71 |
| 2002/0186811 | A1 * | 12/2002 | Weiss et al. | 378/34 |
| 2003/0227954 | A1 | 12/2003 | Ariga et al. | |
| 2004/0079902 | A1 * | 4/2004 | Bristol | 250/504 R |

FOREIGN PATENT DOCUMENTS

EP   1517183 A1 *  3/2005
JP   1-225186       9/1989

* cited by examiner

*Primary Examiner*—David A Vanore
*Assistant Examiner*—Michael Maskell
(74) *Attorney, Agent, or Firm*—David S. Safran; Roberts Mlotkowski Safran & Cole, P.C.

(57) ABSTRACT

To effectively eliminate radiation outside the band with a wavelength of 13.5 nm which has adverse effects on exposure without reducing the intensity of the EUV radiation with a wavelength of 13.5 nm, in an extreme UV radiation exposure tool which has an extreme UV radiation source device with an EUV focusing mirror which focuses extreme UV radiation and radiation outside the band which is emitted by the high density and high temperature region of a plasma, an illumination optical system for projecting this radiation onto a mask, and a projection optical system which projects the radiation from the mask onto a workpiece, a radiation shield is provided of a size which enables the radiation emerging from the EUV focusing mirror to be completely incident on it, and which has an opening of a size which results in essentially only extreme UV radiation being transmitted through it.

20 Claims, 15 Drawing Sheets

Section A-A

Fig. 11 (a)
Fig. 11 (b)
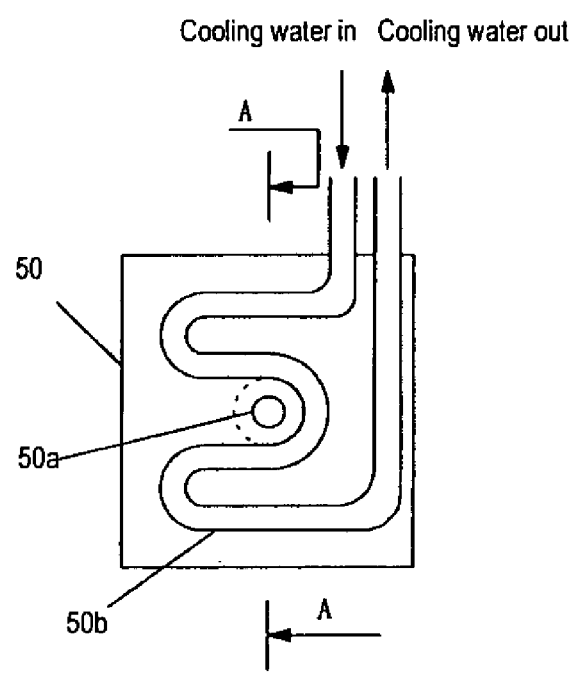
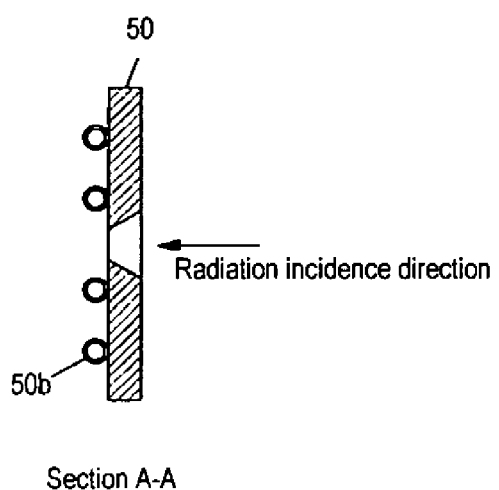
Section A-A

Fig. 12 (a)
Fig. 12 (b)
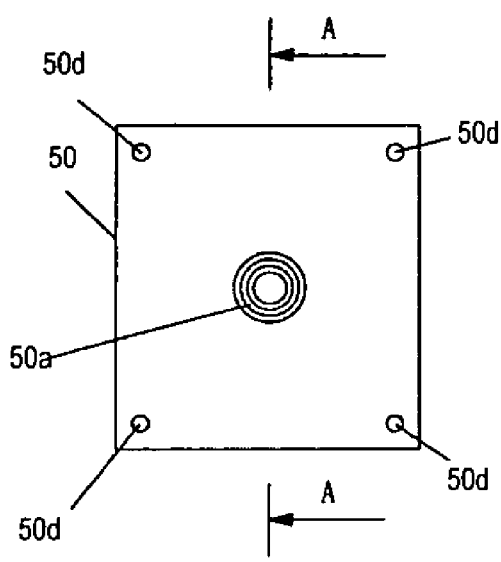
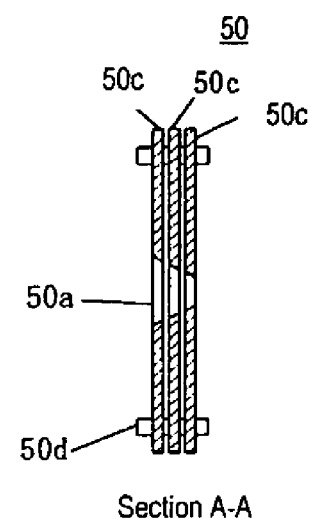
Section A-A

EXTREME UV RADIATION EXPOSURE TOOL AND EXTREME UV RADIATION SOURCE DEVICE

BACKGROUND OF THE INVENTION

1. Field of the Invention

The invention relates to an extreme UV radiation source device with the function of wavelength selection of extreme UV radiation from radiation which is emitted from a plasma. The invention also relates to an extreme UV radiation exposure tool using this extreme UV radiation source device as a radiation source.

2. Description of Related Art

According to the miniaturization and increased integration of an integrated semiconductor circuit, an increase in resolution is required in a projection exposure tool for purposes of its manufacture. To meet this requirement, the wavelengths of the exposure light source are being increasingly shortened. As a semiconductor exposure light source of the next generation in succession to an excimer laser device, an extreme UV radiation source device (hereinafter also called an EUV radiation source device) is being developed which emits EUV radiation (extreme ultraviolet radiation) with wavelengths from 13 nm to 14 nm, especially with a wavelength of 13.5 nm.

Several schemes are known for producing EUV radiation in an EUV radiation source device. In one, by heating and excitation of an EUV radiating fuel, a high density and high temperature plasma is produced and EUV radiation is extracted from this plasma.

The EUV radiation source device adopting such a scheme based on the method of producing a high density and high temperature plasma is roughly divided into an EUV radiation source device of the LPP (Laser Produced Plasma) type and into an EUV radiation source device of the DPP (Discharge Produced Plasma) type (for example, reference is made to "Current situation and future prospect of research on an EUV (extreme UV) radiation source for lithography", J. Plasma Fusion Res. March 2003, Vol. 79, No. 3, pp. 219-260).

In an EUV radiation source device of the LPP type, EUV radiation from a high density and high temperature plasma is used which is formed when targets, such as solids, liquid, gas and the like, are irradiated with a pulsed laser.

On the other hand, in an EUV radiation source device of the DPP type, EUV radiation from a high density and high temperature plasma which has been produced by power current driving is used. The discharge method in an EUV radiation source device of the DPP type, as described in "Current situation and future prospect of research on an EUV (extreme UV) radiation source for lithography", J. Plasma Fusion Res. March 2003, Vol. 79, No. 3, pp. 219-260, is a Z pinch method, a capillary discharge method, a dense plasma focus method, a hollow cathode triggered Z pinch method and the like. The EUV radiation source of the DPP type, compared to the EUV radiation source of the LPP type, has the advantages of a small radiation source device and a small power consumption of the radiation source system. Practical use in the market is strongly expected.

Since material for EUV radiation has very low transparency, reducing projection using a transparent optical system cannot be achieved. For an exposure optical system in an extreme UV radiation exposure tool using the EUV radiation source device as the radiation source (hereinafter also called an EUV exposure tool), therefore, solely a reflection optical system including a mask is used. The mirror which is used in this reflection optical system and which reflects EUV radiation with a wavelength of 13.5 nm is, for example, a multi-layer mirror of Mo (molybdenum) and Si (silicon)

In FIG. 14, the arrangement of one example of an EUV exposure tool using an EUV radiation source of the DPP type is shown. As shown in FIG. 14, the EUV exposure tool formed, for the most part, of an EUV radiation source device 10 and an exposure machine 20.

In the figure, the EUV radiation source device of the DPP type has a chamber 1 as the discharge vessel in which, for example, a first ring-like main discharge electrode (cathode) 3a and a second ring-like main discharge electrode (anode) 3b are arranged such that a ring-like insulating material 3c is clamped by them. The chamber 1 is comprised of a first vessel 1a on the side of the first main discharge electrode of electrically conductive material and a second vessel 1b on the side of the second main discharge electrode, likewise, of electrically conductive material. The first vessel 1a and the second vessel 1b are separated and insulated from one another by the above described insulating material 3c.

The ring-like first main discharge electrode 3a, the ring-like second main discharge electrode 3b and the insulating material 3c are arranged such that their respective through openings are arranged essentially coaxially, and thus, form a continuous opening.

The chamber 1 is supplied with a raw material which contains an EUV radiation fuel from a raw material supply unit 11 which is connected to a raw material feed opening 2 on the side of the first vessel 1a of the chamber. The above described raw material is, for example, $SnH_4$ gas, Xe gas, or the like. Furthermore, a gas evacuation unit 13 is connected to a gas outlet opening 7 which is located on a side of the second vessel 1b of the chamber 1 and is used to evacuate the chamber and to adjust the pressure within the chamber based on the measured value of a pressure monitor (not shown) which monitors the pressure within the chamber.

Furthermore, within the second vessel 1b of the chamber 1, there is an EUV focusing mirror 5. The EUV focusing mirror 5 has several mirrors which are formed, for example, in the shape of ellipsoids of rotation with different diameters or in the form of paraboloids of rotation with different diameters. These mirrors are arranged coaxially such that the center axes of rotation come to rest on one another so that the focal positions essentially agree with one another. These mirrors can advantageously reflect EUV radiation with an oblique angle of incidence of 0° to 25°.

If, in such a radiation source device of the DPP type, between the first and the second main discharge electrodes 3a 3b, pulsed power is supplied from a high voltage pulse generating part 12, on the surface of the insulating material, a creeping discharge is formed, by which essentially a short circuit state is formed between the first and the second main discharge electrodes 3a, 3b and a pulse-like large current flows. In this connection, a plasma 8 is formed in the essentially coaxial through openings which are formed by the ring-like first main discharge electrode 3a, the ring-like second main discharge electrode 3b and the insulating material 3c, or in the vicinity of the through openings. Afterwards, an area of high density and high temperature plasma is formed by Joulean heating by the pinch effect essentially in the middle area of the above described plasma 8. EUV radiation with a wavelength of 13.5 nm is radiated from this area of a high density and high temperature plasma.

The EUV radiation emitted from the area of a high density and high temperature plasma with a wavelength of 13.5 nm is focused by the above described EUV focusing mirror 5 and extracted from an EUV radiation exit part 6 located in a second vessel 1b to a subsequent stage. This EUV radiation exit part 6 is coupled to an EUV radiation incidence part 22 which is located in the exposure machine frame 21 of the exposure machine. This means that the EUV radiation which has been focused by the focusing mirror 5 is incident in the exposure machine via the EUV radiation exit part 6 and the EUV incidence part 22.

In a radiation source device of the DPP type, there can also be a pre-ionization means with which the raw material which has been supplied to the chamber is subjected to pre-ionization when a discharge is produced in the chamber and which contains the EUV radiation fuel. When EUV radiation is produced, the pressure within the chamber is adjusted, for example, to 1 Pa to 20 Pa. Under such a low pressure, the formation of a discharge depending on the electrode arrangement is made difficult. As a result, there are also cases in which the output of the EUV radiation becomes unstable. In order to produce a stable discharge in a situation in which a discharge forms with difficulty, it is desirable to carry out pre-ionization.

Furthermore, between the area of the high density and high temperature plasma (for the arrangement of the example shown in FIG. 14, the essentially coaxial through openings which are formed through the ring-like first main discharge electrode 3a, the ring-like second main discharge electrode 3b and the insulating material 3c or the vicinity of these through openings) and the EUV focusing mirror 5, there is a debris trap 4 which is used to capture debris and the like and for transmission of only EUV radiation. The debris trap 4, as is described in Japanese Patent Application Publication JP-A-2002-504746 (U.S. Pat. No. 6,359,969 B1), is formed of several plates which are located in the radial direction of the producing area for a high density and high temperature plasma. This debris trap captures debris, such as metallic powders, particles and the like, which is produced by sputtering of a metal (for example, of the discharge electrodes) which is in contact with the high density and high temperature plasma, by the above described plasma, and captures debris, debris as a result of a radiating fuel, such as Sn or the like, and others.

The EUV radiation source device of the DPP type shown in FIG. 14 also has a radiation source control element 14 which controls the high voltage pulse generating part 12, the raw material supply unit 11 and the gas evacuation unit 13 based on an EUV emission command or the like from an exposure machine control element 41.

On the other hand, all components of the exposure machine 20, such as the illumination optical system 24, the mask 25, the projection optical system 26, the workpiece 27, the workpiece support 28 and the like are mounted in a vacuum, since EUV radiation is absorbed by air. These components, as is shown, for example, in FIG. 14, are all located within the exposure machine frame 21. The inside of the exposure machine frame 21 is evacuated by a gas evacuation unit 31 which is connected to a gas outlet opening 29 located in the exposure machine frame 21, and achieves a vacuum state.

As was described above, the EUV radiation exit part 6 located in the EUV radiation source device 10 and the EUV radiation incidence part 22 which is located in the exposure machine frame 21 are coupled to one another. The inside of the chamber of the EUV radiation source device 10 and the inside of the exposure machine frame 21 have arrangements which can be differentially evacuated by the respectively arranged gas evacuation units 13, 31.

The illumination optical system 24 which is located in the exposure machine 20 adjusts the EUV radiation incident from the EUV radiation incidence part 22 and illuminates the mask 25 of the reflection type in which a circuit pattern is drawn. As was described above, for the optical system within the exposure machine, a reflection optical system including a mask 25 is used. The illumination optical system 24 is formed of at least one optical element of the reflection type, such as a reflector or the like.

The radiation reflected by the mask 25 of the reflection type is projected onto the workpiece 27, reduced by the projection optical system 26. When a photoresist is applied to the workpiece 27, the circuit pattern of the mask which has been subject to reduced projection is formed on the above described resist. For the above described projection optical system 26 as for the illumination optical system 24, an optical system of the reflection type is used and is formed of at least one optical element of the reflection type, such as a reflector and the like. The illumination optical system 24 and the projection optical system 26, as shown in FIG. 14, are used to facilitate the description and do not constitute a practical arrangement of the optical elements.

Generally, the area which has been projected onto the workpiece is a circular arc-shaped slit area. By synchronous scanning of the mask support on which the mask is placed, and of the workpiece support onto which the workpiece is placed, with a speed ratio which corresponds to a reducing sensitivity factor, a rectangular exposure area is implemented.

The exposure machine 20 which is shown in FIG. 14 has an exposure machine control element 41 which controls the evacuation unit 31 on the side of the exposure machine, a mask support drive control element 33 which subjects the mask support 23 to driving control, and a workpiece support driving control element 32 which subjects the workpiece support 28 to driving control.

It goes without saying that the above described exposure machine 20, like the conventional exposure tool, has a workpiece alignment device, transport systems for the mask and the workpiece and the like, although they are neither shown in the drawings nor described in the text.

FIG. 15 schematically shows the arrangement of an example of an EUV exposure tool using an EUV radiation source of the LPP type. The EUV exposure tool shown in FIG. 15 has an EUV radiation source device 10 and an exposure machine 20, like the device shown in FIG. 14. Since the exposure machine 20 as shown in FIG. 15 has the same arrangement as the one shown in FIG. 14, it will no longer be described here, but an EUV radiation source device of the LPP type is described below.

As is shown in FIG. 15, the EUV radiation source device of the LPP type has a chamber 1 as the discharge vessel, which is penetrated by a nozzle 11a to which a raw material supply unit 11 is connected. The sealing action within the chamber 1 is maintained. Neither gas leaks nor the like occur out of the area of the chamber 1 which is penetrated by the nozzle 11a. In this arrangement, a raw material which contains an EUV radiation fuel is supplied from the tip of the nozzle 11a of the chamber 1. The above described raw material which has been supplied via the nozzle 11a of the chamber 1 is, for example, Xe or $SnH_4$ and is supplied to the chamber in a liquified state, a gaseous state or the like.

Furthermore, a gas evacuation unit 13 is used to control the pressure of the generating area for a high density and high temperature plasma based on the measured value of a pressure monitor (not shown) which monitors the pressure within the chamber 1, and to evacuate the chamber 1, is connected to a gas outlet opening 7 which is located in the chamber 1.

A laser device 15 which is, for example, a pulsed laser device with a repetition frequency of a few kHz, a YAG laser, a carbon dioxide gas laser device, an excimer laser device or the like is used for this purpose. The laser beam emitted from the laser device 15 is fed into the chamber 1 through a laser beam incidence window 16 which is located in the wall of the chamber 1 by being focused by a laser beam focusing means 15a, such as a convex lens or the like.

The raw material supplied to the nozzle 11a is irradiated with a laser beam which has been admitted by the laser beam incidence window 16. The raw material is fed in the direction to the focusing point of the laser beam which is focused by the laser beam focusing means 15a. The raw material which has been irradiated with the laser beam is heated or excited, by which a plasma, including the area of the high density and high temperature plasma, is formed, from which EUV radiation with a wavelength of 13.5 nm is emitted.

The emitted EUV radiation is reflected by an EUV focusing mirror 17 located in the chamber 1 and is extracted by an EUV radiation exit part 6 which is coupled to the EUV radiation incidence part 22 which is located in the exposure machine frame of the exposure machine 20. This means that the EUV radiation focused by the EUV focusing mirror 17 is incident via the EUV radiation exit part 6 and the EUV radiation incidence part 22 in the exposure machine 20. The above described EUV focusing mirror 17 is, for example, a spherical mirror.

Between the high density and high temperature plasma 8 and the EUV focusing mirror 17 is the above described debris trap 4 which is used to capture debris and the like and for transmission of solely EUV radiation. The debris trap 4 is formed, as is described in Japanese Patent Application Publication JP-A-2002-504746 (U.S. Pat. No. 6,359,969 B1) of several plates which are arranged in the radial direction of the producing area for a high density and high temperature plasma. This debris trap captures debris, such as metallic powders, particles or the like, and captures debris which is formed from the radiation fuel, such as Sn or the like, and the like.

Furthermore, the EUV radiation source device of the LPP type shown in FIG. 15 has a radiation source control element 14 which controls the laser device 15, the raw material supply unit 11 and the gas evacuation unit 13 based on an EUV emission command or the like from an exposure machine control element 41.

It has been found that the radiation emitted from an EUV radiation source device contains not only EUV radiation with a wavelength of 13.5 nm, which is necessary for exposure, but also contains radiation outside of the wavelength of 13.5 nm (hereinafter also called "radiation outside the band"). This means that, in a process (ionization or excitation process) in which a raw material which contains an EUV radiation fuel is heated by laser radiation, a Z pinch effect after formation of a discharge, or by similar methods, the density and the temperature of the formed plasma are increased and EUV radiation with a wavelength of 13.5 nm is emitted, different energy transitions take place in which radiation with different wavelengths is emitted.

As was described above, the exposure optical system (illumination optical system, mask, projection optical system) for an EUV exposure tool is, for example, a reflection optical system using a multilayer Mo/Si mirror. A multilayer Mo/Si mirror has reflection properties not only for EUV radiation with a wavelength of 13.5 nm, but reflection properties relative to UV radiation, visible radiation and IR radiation. Therefore, radiation which is outside of the band and which is in the wavelength range outside of EUV radiation with a wavelength of 13.5 nm reaches the workpiece in the reflection optical system.

If a photoresist has been applied to the workpiece, exposure also takes place by radiation in a wavelength band of 150 nm to 300 nm, because a photoresist for EUV radiation with a wavelength of 13.5 nm often has a general sensitivity relative to radiation in the wavelength band from 130 nm to 400 nm (UV radiation), especially radiation in the wavelength band from 150 nm to 300 nm.

The image resolution R for exposure is $R=k\lambda/NA$, where $\lambda$ is the exposure wavelength, NA is the numerical aperture and k is a constant. The resolution for exposure by radiation in the wavelength band from 150 nm to 300 nm which has longer wavelengths than EUV radiation is therefore lower than the resolution in exposure by EUV radiation. Specifically, if there is radiation in the wavelength band from 130 nm to 400 nm (UV radiation), especially radiation in the wavelength band from 150 nm to 300 nm, exposure with the desired resolution is not possible. This means that radiation in a wavelength band from 150 nm to 300 nm causes a reduction of the image resolution during exposure.

On the other hand, if radiation in the wavelength band of at least 800 nm (IR radiation) reaches the workpiece through an exposure optical system using a reflection optical system and is absorbed, thermal deformation of the workpiece itself is caused. The exposure surface of the workpiece therefore assumes an unwanted shape. As a result, the exposure performance decreases.

As was described above, radiation which is outside the band causes a degradation of the exposure performance of an EUV exposure tool. Therefore, it is necessary to reduce this radiation which is incident in the exposure optical system and which is outside the band as much as possible.

As one of the wavelength selection means for extraction of EUV radiation with a wavelength of roughly 13.5 nm which is necessary for exposure from radiation which is emitted by an EUV radiation source device, it can be imagined that an optical filter be used which transmits only the required wavelength bands. For example, a Zr (zirconium) thin layer filter transmits only EUV radiation with wavelengths from 5 nm to 20 nm. The transmittance of the EUV radiation with a wavelength of 13.5 nm for a Zr filter with a thickness, for example, of 200 nm is, however, roughly 50%. The usable intensity of the EUV radiation with a wavelength of 13.5 nm is therefore reduced considerably.

To increase the exposure throughput, it is necessary to increase the intensity of the EUV radiation incident in the exposure optical system with a wavelength of 13.5 nm, and thus, the amount of exposure. As described, for example, in "Development of the base technology of an extreme UV radiation (EUV) exposure system," Research Report of the Technology-Research Association "Technology development organization for extreme UV radiation exposure systems (EUVA)", p. 150, published on May 30, 2003, it was computed by way of a sample that to expose 100 wafers per hour, radiation with a wavelength of 13.5 nm with at least 115 W must be allowed to be incident in the exposure optical system.

As was described above, when using a Zr filter as the wavelength selection means, the transmittance of the EUV radiation with a wavelength of 13.5 nm is roughly 50%. Extraction of EUV radiation with the intensity required for exposure from an EUV radiation source device is therefore accompanied by difficulties.

Furthermore, it can be imagined that a diffraction grating can be used as another wavelength selection means. In this connection, radiation from an EUV radiation source device is incident in a diffraction grating and is spectrally decomposed, by which only EUV radiation with a wavelength of 13.5 nm is extracted.

However, since a diffraction grating is an optical element with which spectral decomposition takes place using angular dispersion of the wavelength, in the case of using radiation from an EUV radiation source device with low directivity, in contrast to laser radiation, it is necessary on the radiation incidence side of the diffraction grating to use a slit in order to limit the angle of incidence of the radiation emitted by the EUV radiation source device into the diffraction grating. Furthermore, if the reflectance of the reflection surface of the diffraction grating with respect to the EUV radiation and the diffraction efficiency of the diffraction grating with respect to the EUV radiation are considered, the intensity of the extracted EUV radiation decreases significantly, even if only EUV radiation with a suitable wavelength is selected and extracted using the diffraction grating from the radiation which is emitted by the EUV radiation source device.

That is, with consideration of the intensity of the EUV radiation which is necessary for exposure, use of a diffraction grating as a wavelength selection element is virtually impossible in practice.

As was described above, extraction of the EUV radiation with a wavelength of 13.5 nm with the intensity required for exposure by using a conventional wavelength selection means and by eliminating the radiation which is outside the band and which has adverse effects on exposure is extremely difficult.

SUMMARY OF THE INVENTION

The invention was devised to eliminate the above described disadvantages in the prior art. Thus, a primary object of the invention is to devise an extreme UV radiation exposure tool and extreme UV radiation source device in which the intensity of the EUV radiation with a wavelength of 13.5 nm as the exposure radiation is not reduced and in which the radiation which is outside the band and which has adverse effects on exposure can be eliminated with high efficiency.

As was described above, the raw material which is fed into the chamber and which contains EUV radiation fuel (for example, Xe gas, $SnH_4$ gas or the like) produces EUV radiation after processes of heating, ionization and excitation. Various energy transitions in which radiation is emitted with different wavelengths are formed in these radiation processes. The radiation emitted by an EUV radiation source device contains specifically, not only EUV radiation with a wavelength of 13.5 nm which is necessary for exposure, but also radiation outside the wavelength of 13.5 nm (radiation outside the band).

The wavelength distribution intensity of the emitted radiation depends on the average ion valence of the plasma which depends on the plasma temperature. This means that, if the plasma temperature is high and the average ion valence is large, the proportion of short wavelengths is large. If the plasma temperature is low and the average ion valence is small, the proportion of long wavelengths is large.

As a result of research on an EUV radiation source device of the DPP type, it was found that a plasma produced by a pulsed discharge after the processes of heating, ionization and excitation, in the essentially middle area of which a region of high density and high temperature, plasma is formed, has a spatial distribution of temperature according to which the spatial distribution of ions differs for each average ion valence. It was found that, as a result, the wavelength of the radiation emitted by the plasma has a spatial distribution.

The reason for formation of a spatial distribution of temperature in the plasma is not clear, but the following can be imagined.

In the case of an EUV device of the DPP type, in a pulsed discharge by one of the discharge methods, i.e., the Z pinch method, capillary discharge method, plasma focus method, hollow cathode triggered Z pinch method and the like, the plasma is compressed by the effect of the Z pinch or the like as a result of the discharge current, by which a high density and high temperature plasma is formed. Shortly afterwards, the plasma is adiabatically expanded according to the drop of the discharge current, by which the plasma temperature drops. It can be imagined that, for a plasma which is obtained by one-time discharge operation, a spatial distribution of temperature forms as a result. In an EUV radiation source device of the DPP type, therefore, regardless of the discharge method, the wavelength of the radiation emitted by the plasma has a spatial distribution.

On the other hand, in the EUV radiation source device of the LPP type, a region of a high density and high temperature plasma is formed if a raw material which contains an EUV radiating fuel is irradiated with a pulsed laser. Shortly afterwards, the plasma is adiabatically expanded according to the decrease of the laser pulse, by which the plasma temperature drops. It can be imagined that, for a plasma which is obtained by a one-time pulsed laser irradiation operation, a spatial distribution of temperature forms as a result. In an EUV radiation source device of the LPP type, therefore, the wavelength of the radiation emitted by the plasma has a spatial distribution.

Therefore, in an EUV radiation source device of the DPP type, the spatial distributions of the EUV radiation with a wavelength of 13.5 nm and the radiation outside the band were studied, which are emitted by the plasma which is formed in a pulsed discharge by using Xe gas as the raw material which contains an EUV radiation fuel. The radiation outside the band is radiation in the wavelength range of 140 nm to 4000 nm.

FIG. 2 shows an arbitrary cross section which is perpendicular to the direction of the optical axis of a focusing optical system through an EUV focusing mirror. In this connection, one example of the spatial distributions of illuminance of the radiation intensity of EUV radiation with a wavelength of 13.5 nm and the radiation outside of the band in a cross section of the plasma which is formed by the pulsed discharge is shown.

The distributions of the EUV radiation with a wavelength of 13.5 nm and of the radiation outside the band which are shown in FIG. 2 are distributions in certain one-dimensional directions in the above described arbitrary cross section.

As becomes apparent from FIG. 2, the irradiance region of the EUV radiation with a wavelength of 13.5 nm in the above described cross section is essentially in the middle of the plasma on the optical axis, while the irradiance region of the radiation outside the band is broadened by roughly a factor of ten more than the irradiance region of the radiation with a wavelength of 13.5 nm. This shows that the radiation emitted by the plasma emission point on the radiation incidence plane has a spatial distribution of wavelength.

In the case in which the EUV focusing mirror, as the focusing optical means, focuses the radiation emitted by the plasma, the spatial distribution of the wavelength of the radiation concentrated on the focusing point reflects the spatial distribution of wavelength in the above described cross section of the plasma as the emission point.

FIG. 3 shows the distribution of the illuminance of the EUV radiation with a wavelength of 13.5 nm on the focal plane (plane perpendicular to the optical axis including the focusing point on the optical axis) if, in the above described cross section, the radiation emitted by an emission point with the wavelength distribution shown in FIG. 2 is focused by the EUV focusing mirror, as focusing optical means, from a reflector in the form of an ellipsoid of rotation.

On the other hand, FIG. 4 shows the distribution of the illuminance of the radiation outside the band, i.e., in the wavelength range from 140 nm to 4000 nm, onto the above described focal plane.

The distributions of the illuminance shown in FIGS. 3 and 4 are distributions in certain one-dimensional directions including the focusing points on the above described focusing plane. The above described one-dimensional directions in FIGS. 3 and 4 agree with one another.

In FIGS. 3 and 4, the x-axis plots the distance from the optical axis of the above described one-dimensional direction and the y-axis plots the illuminance (W/mm$^2$) of the EUV radiation with a wavelength of 13.5 nm and the radiation outside the band.

As FIG. 3 shows, the EUV radiation with a wavelength of 13.5 nm has a distinct distribution of the illuminance on the focal plane in a relatively narrow region around the optical axis.

On the other hand, as is apparent from FIG. 4, the radiation outside the band on the focal plane does not have a distinct distribution of the illuminance. Furthermore, the inventor has confirmed that, even in a relatively wide region with a distance from the optical axis of at least 4 mm the absolute value of the illuminance in the kind of distribution on the focal plane shown in FIG. 4 is present, although this circumstance is not shown in FIG. 4.

This means that it was found that, on the focal plane, the EUV radiation with a wavelength of 13.5 nm passes through a relatively narrow region around the optical axis, while the radiation outside the band passes through a relatively wide region around the optical axis.

Therefore, if a radiation shielding means with a suitable opening diameter is located on the focal plane, for example, the EUV radiation with a wavelength of 13.5 nm passes for the most part through the above described opening. Moreover, it becomes possible for the radiation outside the band to be, for the most part, shielded by the above described radiation shielding means.

This spatial distribution of wavelength is not limited to the focal plane of the EUV focusing mirror. As a result of an experiment, it was found that, between the EUV focusing mirror of the EUV radiation source device and the optical elements of the illumination optical system of the exposure machine, such as the reflector and the like, in which the radiation is first incident, the same tendency prevails in any cross section which is perpendicular to the optical axis of the EUV focusing mirror.

This means that the above described radiation shielding means need not necessarily be located on the focal plane, but can be located between the EUV focusing mirror of the EUV radiation source device and the optical elements of the illumination optical system of the exposure machine, such as the reflector and the like, in which the radiation is first incident, and the same effect can still be obtained.

According to the invention, the radiation shielding means with an opening is inserted into the optical path using the spatial distribution of wavelength as the specific property of the radiation emitted from the above described EUV radiation source device. In this way, in accordance with the invention, without reducing the power of the EUV radiation with a wavelength of 13.5 nm as the exposure radiation, it becomes possible to eliminate the radiation outside the band which has adverse effects on the exposure with high efficiency.

As was described above, as in the EUV radiation source device of the DPP type, the plasma which has been produced by the laser radiation in the EUV radiation source device of the LPP type has a spatial distribution of wavelength. Therefore, the invention can also be used for an EUV radiation source device of the LPP type.

Based on the above described findings, the above described object is achieved in accordance with the invention in an extreme UV radiation exposure tool which has an extreme UV radiation source device with the following:
  a vessel;
  a raw material supply means which supplies a raw material which contains an EUV radiation fuel and/or a compound of an extreme UV radiation fuel to this vessel;
  a heating and/or excitation means which heats and/or excites the raw material supplied to the above described vessel, and thus, produces a plasma which surrounds a high density and high temperature region essentially in its middle which emits extreme UV radiation;
  an evacuation means which is connected to the vessel;
  a optical focusing means which is located in the above described vessel such that radiation with a spatial distribution of wavelength emitted from the above described plasma is focused which is composed of extreme UV radiation which is emitted from the high density and high temperature region of the above described plasma and of radiation outside of the extreme UV radiation, this radiation being emitted from an area outside the high density and high temperature region of the above described plasma; and
  a radiation exit part for extracting the above described focused radiation.

The UV radiation exposure tool of the invention also comprises:
  a mask in which a pattern is formed;
  an illumination optical system which is comprised of at least one optical element and which projects radiation which contains the radiation extracted from the radiation exit part of the above described extreme UV radiation source device onto the above described mask; and
  a projection optical system which subjects the radiation which the above described mask has reflected to projection imaging onto a workpiece.

Most importantly, according to the invention, there is a radiation shielding means as described below and which is provided with an opening.

That is, as shown in FIG. 1, a radiation shielding means (aperture component 50) provided with an opening is positioned in the space of the optical path between the optical focusing means (EUV focusing mirror 5) of the above described extreme UV radiation source device and optical elements of the above described illumination optical system 24 into which the radiation which is incident from the optical focusing means of the above described extreme UV radiation source device is first incident is located at the point which is opposite the radiation emerging from the above described focusing optical means.

The size of the radiation incidence side of the above described radiation shielding means (aperture component 50) is fixed at a size at which the radiation emerging from the above described optical focusing means can be completely incident in the above described point. For the opening of the radiation shielding means located at the above described point, the size and the location are fixed for a radiation shielding means for which essentially only extreme UV radiation is transmitted from the radiation with a spatial distribution of wavelength incident in the above described radiation shielding means.

Furthermore, the arrangement can also be such that the radiation exit part 6 of the above described extreme UV radiation source device or the radiation incidence part 22 of the exposure machine acts as the radiation shielding means which was described above, and that at least one of the radiation exit part 6 and the radiation incidence part 22 transmits some of the radiation with a spatial distribution of wavelength which emerges from the above described optical focusing means.

Based on the above described findings, the above described object is also achieved in accordance with the invention in an external UV radiation source device which comprises the following:

a vessel;

a raw material supply means which supplies a raw material to this vessel which contains an extreme UV quasi radiation fuel and/or a compound of an extreme UV radiation fuel;

a heating and/or excitation means which heats and/or excites the raw material supplied to the above described vessel, and thus, produces a plasma which surrounds a high density and high temperature region essentially in its middle, which emits extreme UV radiation;

an evacuation means which is connected to the vessel;

a optical focusing means which is located in the above described vessel such that radiation with a spatial distribution of wavelength emitted from the above described plasma is focused, composed of extreme UV radiation which is emitted from the high density and high temperature region of the above described plasma, and of radiation outside the extreme UV radiation, this radiation being emitted from an area outside the high density and high temperature region of the above described plasma; and a radiation exit part for extracting the above described focused radiation, in that there is a radiation shielding means which is described below and which is provided with an opening.

That is, a radiation shielding means provided with an opening in the space of the optical path between the optical focusing means of the above described extreme UV radiation source device and the above described radiation exit part is located at a point which is opposite the radiation emerging from the above described focusing optical means.

The size of the radiation incidence side of the above described radiation shielding means is fixed at a size at which the radiation emerging from the above described optical focusing means can be completely incident in the above described point. For the opening of the radiation shielding means located at the above described point, the size and the location are fixed such that essentially only extreme UV radiation is transmitted from the radiation with a spatial distribution of wavelength incident in the above described radiation shielding means and emerges from the above described optical focusing means.

Furthermore, the arrangement can also be such that the radiation exit part 6 of the extreme UV radiation source device acts as the radiation shielding means which was described above, and that the radiation exit part 6 transmits some of the radiation with a spatial distribution of wavelength which emerges from the above described optical focusing means.

The object is furthermore achieved according to the invention as follows.

(1) The above described radiation shielding means is arranged such that several plate components with openings are each positioned at a distance from one another. The size of the opening of the respective plate component is set such that the smaller it becomes, the more advancement there is in the direction of the optical axis which is established by the above described focusing optical means Moreover, the size of the smallest opening is set to a size at which, of the radiation with a spatial distribution of wavelength incident in the above described radiation shielding means and extracted from the above described radiation exit part, essentially only extreme UV radiation is transmitted.

(2) The above described radiation shielding means is located in the vicinity of the focusing point of the radiation which has been extracted from the above described radiation exit part and which has been focused by the focusing optical means.

(3) The above described radiation shielding means is formed of a metallic material with a high melting point or a ceramic material.

(4) There is a cooling means in the vicinity of the opening of the above described radiation shielding means.

(5) The above described radiation shielding means is arranged such that is can be moved to a position at which the radiation which has been focused by the above described optical focusing means and which contains extreme UV radiation is projected completely onto a region of the above described radiation shielding means which does not have an opening.

(6) The heating and excitation means of the above described extreme UV radiation source device has a pair of discharge electrodes and heats and excites the supplied raw material by discharge, by which a plasma is produced which surrounds the high density and high temperature region essentially in its middle.

(7) The above described heating and excitation means, as a laser radiation irradiation means, heats and excites the above described supplied raw material by laser radiation, by which a plasma is produced which surrounds the high density and high temperature region essentially in its middle.

ACTION OF THE INVENTION

The invention yields the following effects:

(1) Using the spatial distribution of wavelength as a specific property of the radiation emitted from the extreme UV radiation source device, EUV radiation with a wavelength of 13.5 nm can be selectively extracted by the arrangement of the radiation shielding means provided with an opening between the optical focusing means and the optical elements of the illumination optical system or between the optical focusing means and the radiation exit part of the extreme UV radiation source device.

This means that, between the optical focusing means and the optical elements of the illumination optical system, or between the optical focusing means and the radiation exit part of the extreme UV radiation source device, the EUV radiation with a wavelength of 13.5 nm has a distinct distribution of illuminance in an arbitrary cross section perpendicular to the optical axis of the EUV focusing mirror in a relatively narrow region around the optical axis. On the other hand, the radiation outside the band does not have a distinct distribution of illuminance, but in the region which extends relatively far away from the optical axis, it has a distribution of illuminance.

The measure that the radiation shielding means provided with an opening is located at the above described point, that the size of the radiation incidence surface of the above described radiation shielding means is fixed at a size at which the radiation extracted from the above described radiation exit part can be completely incident in the above described point, and that the opening of this radiation shielding means is set according to the spatial distribution of wavelength which is specific to the radiation which is emitted from the above described EUV radiation source, therefore enables selective extraction of the EUV radiation with a wavelength of 13.5 nm from the radiation which is emitted by the extreme UV radiation source device.

By using such a radiation shielding means, differently than in wavelength selection by an optical filter, the EUV radiation with a wavelength of 13.5 nm can be effectively selected and extracted according to the wavelength of the radiation which is emitted by the EUV radiation source device without overly reducing the intensity of the EUV radiation with a wavelength of 13.5 nm as the exposure radiation. Thus, the radiation outside the band which has adverse effects on exposure can be eliminated.

(2) The arrangement of the above described radiation shielding means in which several plate components with openings are arranged at a distance from one another and are adjusted such that each opening is made smaller according to the advancing direction of the radiation makes it possible to avoid the disadvantage as a result of thermal loading by the radiation incident in the radiation shielding means. Since the size of the opening of the respective plate component is reduced in steps, especially along the advancing direction of the radiation, it becomes possible for the thermal loading to be carried by several plate components. Thus, the disadvantage of thermal deformation of the radiation shielding means can be avoided.

(3) As a result of tests and research, it was found that, in an arrangement of the radiation shielding means on the focal plane or in the vicinity of the focal plane of the EUV focusing mirror, wavelength selection of the radiation emitted by the EUV radiation source device can be carried out most effectively. This means that, by the arrangement of the radiation shielding means in the vicinity of the focusing point of the radiation which is focused by the optical focusing means and which is extracted by the above described radiation exit part, it becomes possible to subject the radiation emitted by the EUV radiation source device most effectively to wavelength selection. By the arrangement of the radiation shielding means at the above described point, the region on the radiation incidence surface of the radiation shielding means which is irradiated with radiation which emerges from the EUV focusing mirror is made smaller. Therefore, it becomes possible to also reduce the size of the radiation shielding means.

(4) Due to the arrangement of the above described radiation shielding means of a plate component of a metal with a high melting point or a ceramic material, it is relatively durable. Its handling is simplified and the holding arrangement within the device is not complicated either. Since a plate component is used, only a small space is required for the arrangement. Therefore, an increase in the size of the device is not caused.

(5) The arrangement of the cooling means in the radiation shielding means makes it possible to avoid the disadvantage as a result of the thermal loading by the radiation incident in the radiation shielding means. In particular, this measure is effective in the case of a large thermal loading by the radiation incident in the radiation shielding means, as in the case of an arrangement of the radiation shielding means in the vicinity of the focusing point of the radiation which is focused by the optical focusing means and is extracted by the above described radiation exit part.

(6) If the size of the radiation shielding means, compared to the region on the radiation incidence side of the radiation shielding means which is irradiated with radiation which emerges from the EUV focusing mirror, is set high enough, it becomes possible to use the radiation shielding means as an optical shutter as well. That is, by the measure that the size of the radiation shielding means as the region outside of the opening of the radiation shielding means is made larger than the area on the radiation incidence surface of the radiation shielding means which is irradiated with radiation which emerges from the EUV focusing mirror, and the radiation shielding means is moved in the direction which orthogonally intersects the optical axis, it becomes possible to shield the radiation emerging from the focusing optical means, and the radiation shielding means can act as a shutter. If the above described radiation shielding means is arranged such that it can be moved in the direction which is essentially perpendicular to the optical axis direction and which is established by the focusing optical means, alignment of the opening of the radiation shielding means can be easily done.

The invention is further described below using several embodiments shown in the drawings.

BRIEF DESCRIPTION OF THE DRAWINGS

FIGS. 11(a) & 11(b) are schematic rear and cross-sectional views, respectively, of the arrangement of an example of an aperture component having a water-cooled tube as the cooling means, FIG. 11(b) being taken along line A-A in FIG. 11(a);

FIGS. 12(a) & 12(b) are schematic front and cross-sectional views, respectively, of the arrangement of another embodiment of the aperture component according to the thermal loading, FIG. 12(b) being taken along line A-A in FIG. 12(a);

DETAILED DESCRIPTION OF THE INVENTION

Figure 5:
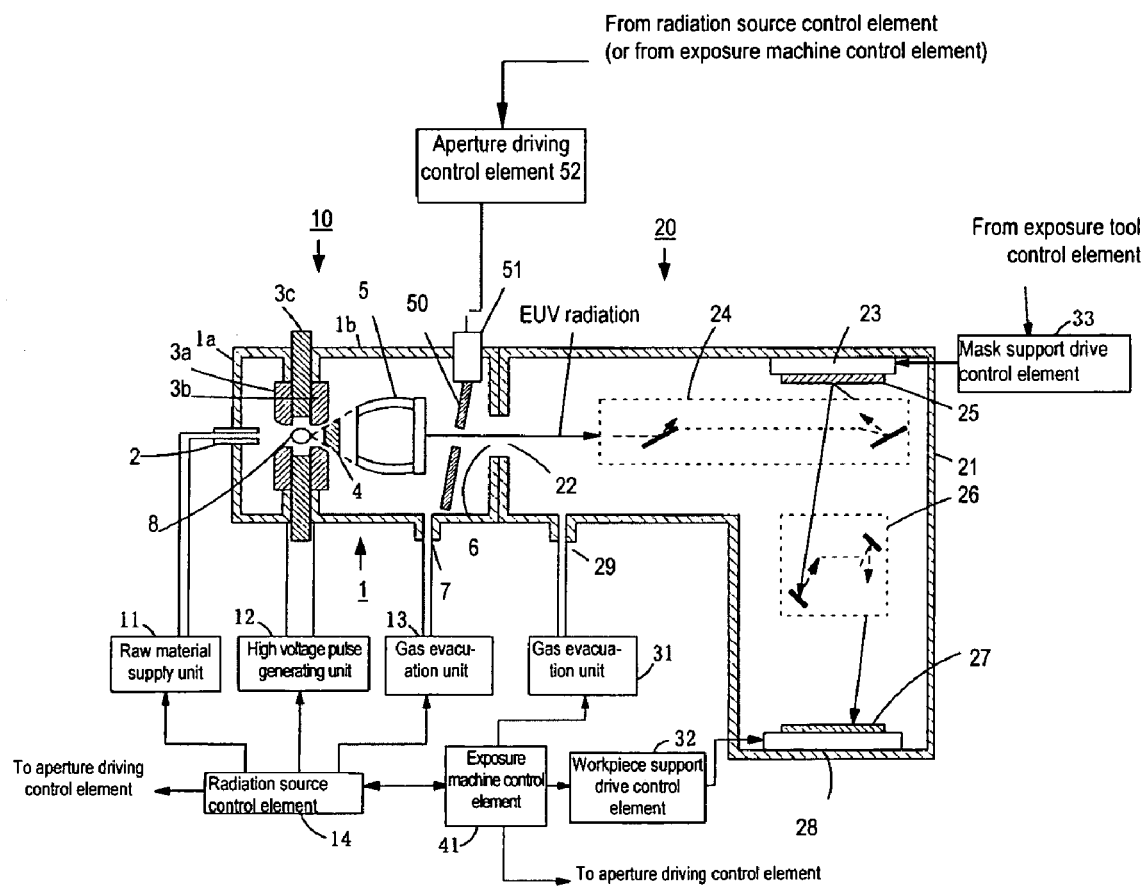
FIG. 5 is a schematic of the arrangement of one embodiment of the EUV exposure tool in accordance with the invention.

FIG. 5 shows the arrangement of an embodiment of the EUV exposure tool of the invention. In the embodiment described below, one example of the use of a radiation source device of the DPP type as the radiation source device is shown. However, as was described above, a radiation source device of the LPP type can also be used.

Figure 14:
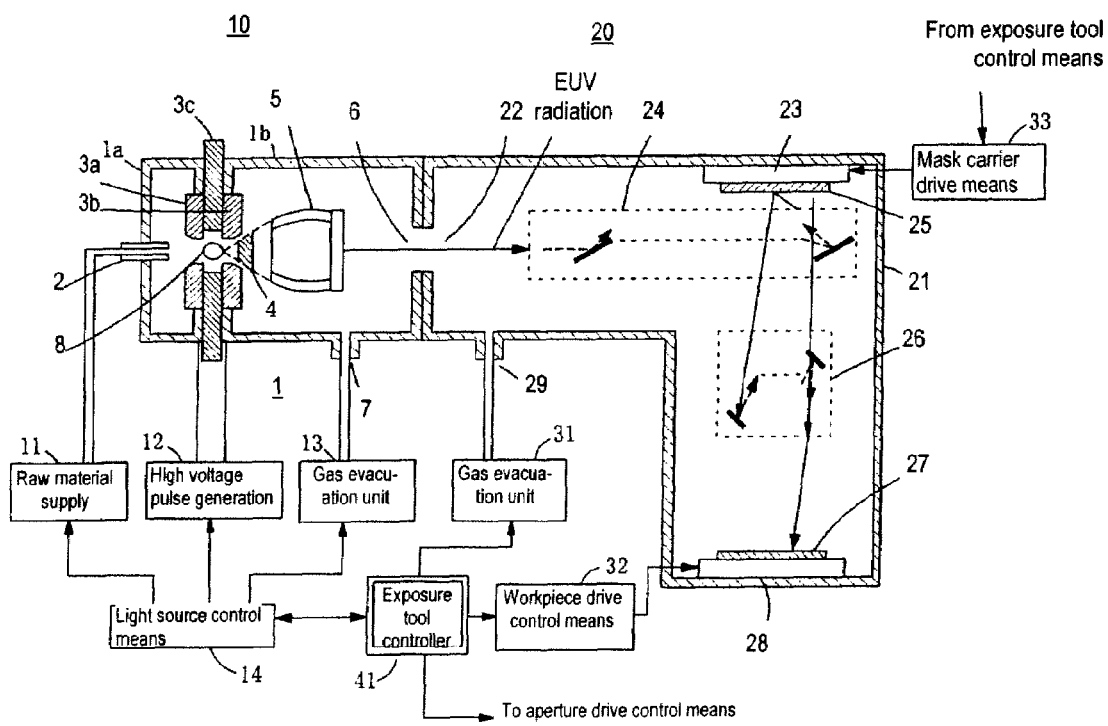
FIG. 14 is a schematic view of the arrangement of an example of an EUV exposure tool using an EUV radiation source of the DPP type and FIG. 15 is a schematic of the arrangement of an example of an EUV exposure tool using an EUV radiation source of the LPP type.
Figure 15:
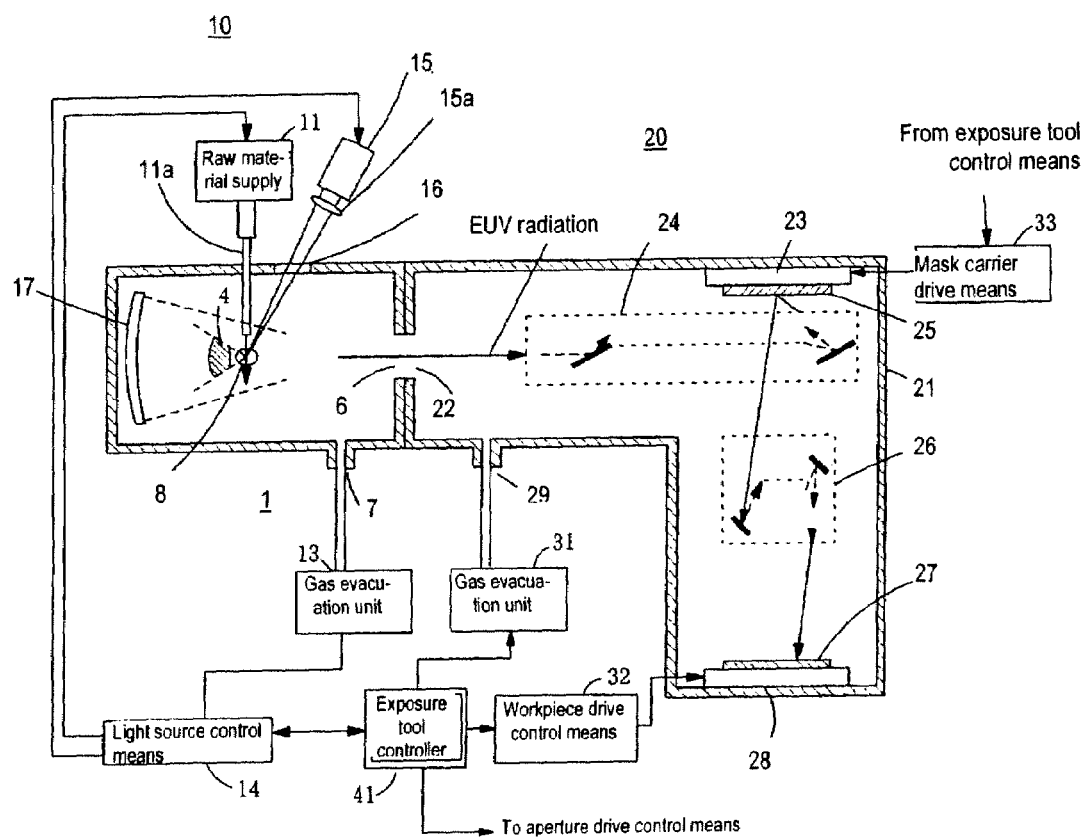

As is shown in FIG. 5, in this embodiment, the EUV exposure tool, for the most part, comprises a radiation source device 10 and an exposure machine 20. In FIG. 5, the same parts as shown in FIG. 14 are provided with the same reference numbers as in FIG. 14. The action of these parts is also identical to the action of the parts in FIG. 14.

In a chamber 1, the first main discharge electrode (cathode) 3a and the second main discharge electrode (anode) 3b are arranged such that a ring-like insulating material 3c is clamped by them. Raw material which contains an EUV radiation fuel is supplied to part 1a of the chamber 1 from a raw material supply unit 11 which is connected to a raw material feed opening 2. A gas evacuation unit 13 for evacuating the chamber is connected to a gas outlet opening 7 which is located on the side of the second vessel 1b of the chamber 1. In the second vessel 1b of the chamber 1, there is an EUV focusing mirror 5. Between the EUV focusing mirror 5 and the area of a high density and high temperature plasma, there is a debris trap 4 which is used to capture debris and the like and for transmission of only EUV radiation.

If pulsed power is supplied between the above described first and second main discharge electrodes 3a, 3b and a region of a high density, high temperature plasma is formed essentially in the middle area of the plasma 8, EUV radiation with a wavelength of 13.5 which is incident in the exposure machine 20 via the EUV radiation exit part 6 and the EUV incidence part 22 is emitted from this area of a high density and high temperature plasma.

In the exposure machine 20, there is an exposure optical system 24 which adjusts the incident EUV radiation and illuminates a mask 25 of the reflection type. The radiation reflected from the mask 25 of the reflection type is reduced and projected by a projection optical system 26 onto the workpiece 27.

In this embodiment, in addition to the above described components, as the shielding means for shielding the above described radiation outside of the band, between the EUV focusing mirror 5 of the EUV radiation source device and the optical elements of the illuminance optical system 24 of the exposure machine 20, such as the reflector and the like in which the radiation is first incident, there is an aperture component 50 as was described above.

Figure 6:
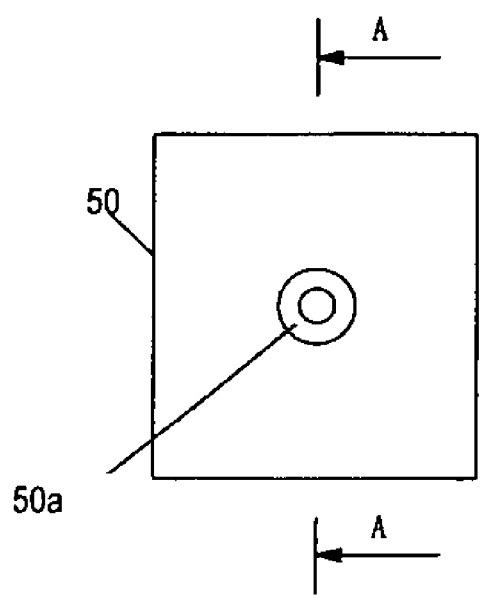
FIGS. 6(a) & 6(b) are schematic plan and cross-sectional views, respectively of the arrangement of an embodiment of the aperture in accordance with the invention, FIG. 6(b) being taken along section line A-A in FIG. 6(a)
Figure 6:
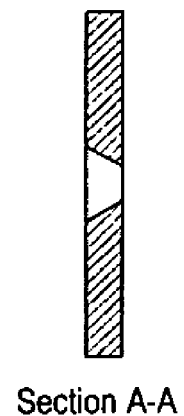

FIGS. 6(a) & 6(b) show the arrangement of one example of the above described aperture. FIG. 6(a) is a schematic in which the aperture component 50 is viewed from the radiation incidence side. FIG. 6(b) is a cross section taken along line A-A as shown in FIG. 6(a).

The aperture component 50, as is shown in FIG. 6(a), is provided with a circular opening 50a. As is apparent from the cross section in FIG. 6(b), the tip area of the opening 50a is formed, for example, in the shape of a knife edge. The position of the above described aperture component 50 is set such that the middle of the opening 50a (center of the circle in the case of a circular opening) is located essentially on the optical axis of the EUV focusing mirror 5.

The aperture component 50 is a plate component formed of a metal with a high melting point, such as, for example, tungsten, molybdenum, tantalum or the like. It can also be made of a ceramic material, such as aluminum oxide or the like.

The radiation which is incident in the aperture component 50 is focused by the EUV focusing mirror 5. Therefore, it is also possible for the radiation reflected from the surface of the aperture component 50 to be focused, for example, onto an unexpected location in the chamber of the EUV radiation source device. Therefore, if necessary, the location of the aperture component 50 can be inclined to a certain degree from a direction perpendicular to the optical axis of the EUV focusing mirror, as is shown in FIG. 5.

Figure 1:
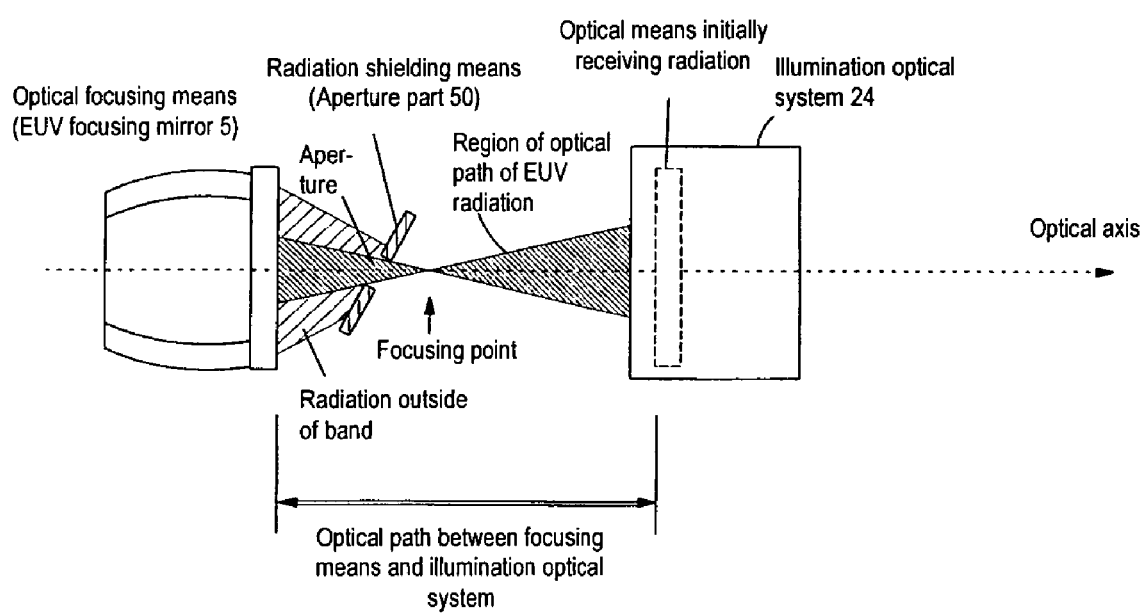
FIG. 1 is a schematic of the arrangement of the radiation shielding means of the invention.
Figure 2:
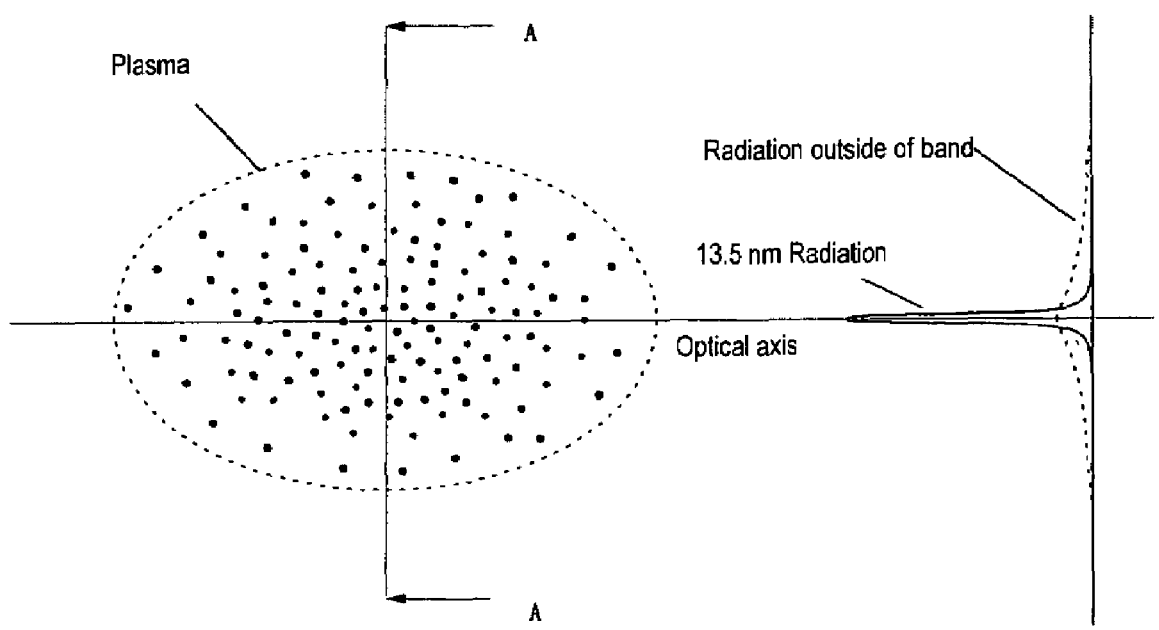
FIG. 2 is a schematic of one example of the spatial distribution of the illuminance of the EUV radiation with a wavelength of 13.5 nm and the radiation outside of the band in an arbitrary cross section of the plasma.
Figure 3:
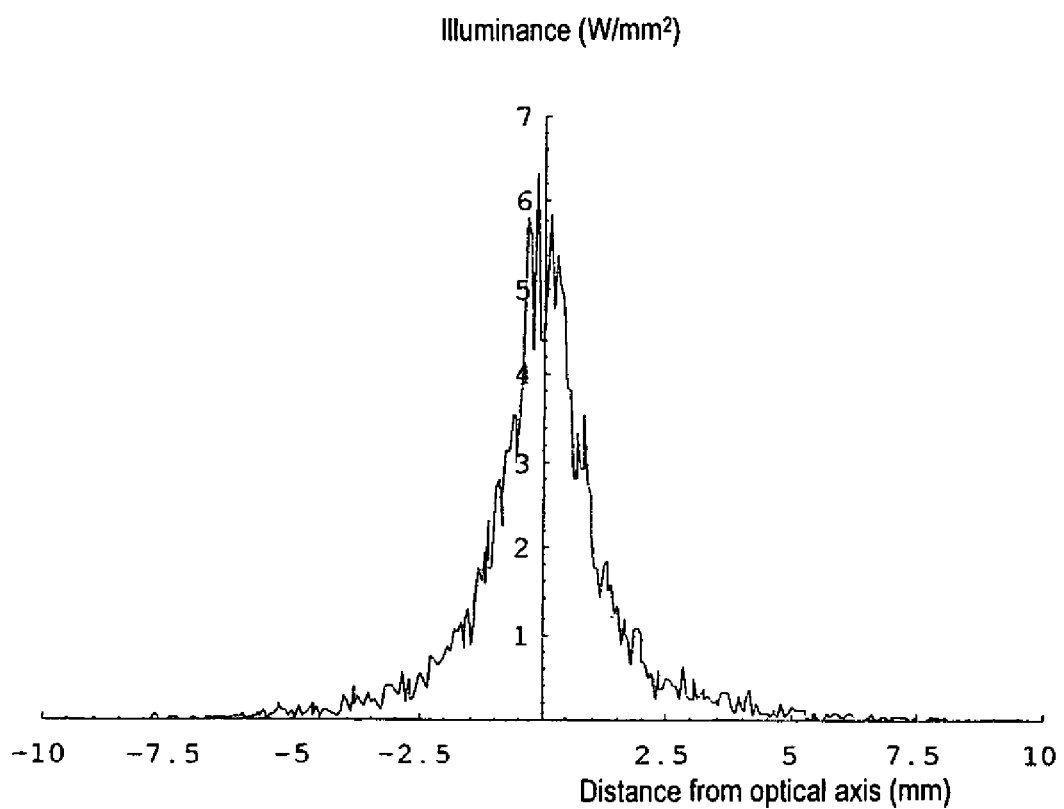
FIG. 3 is a schematic of the distribution of the illuminance of the EUV radiation with a wavelength of 13.5 nm on the focal plane of the EUV focusing mirror.
Figure 4:
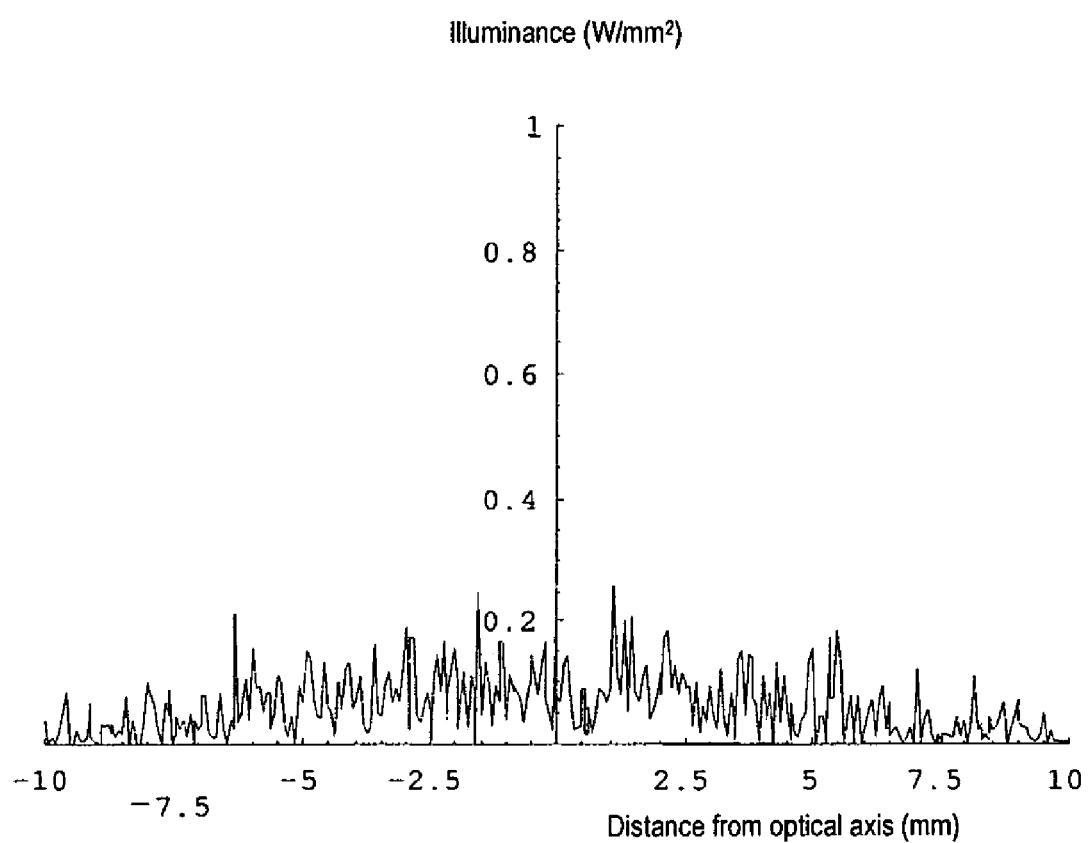
FIG. 4 is a schematic of the distribution of the illuminance of the radiation outside of the band on the focal plane of the EUV focusing mirror.

As was shown in FIG. 3, the EUV radiation with a wavelength of 13.5 nm has a distinct distribution of illuminance on the focal plane in a relatively narrow region around the optical axis. On the other hand, as is shown in FIG. 4, the radiation outside the band does not have a distinct distribution of illuminance on the focal plane.

Such a spatial wavelength distribution is not limited to the focal plane of the EUV focusing mirror. As was described above, between the EUV focusing mirror of the EUV radiation source device and the optical elements of the illumination optical system of the exposure machine, such as the reflector and the like, in which the radiation is first incident, there is the same tendency in an arbitrary cross section which is perpendicular to the optical axis of the EUV focusing mirror.

This means that, between the EUV focusing mirror 5 and the optical elements of the illumination optical system 24 of the exposure machine 20, such as the reflector and the like, in which the radiation is first incident, the EUV radiation with a wavelength of 13.5 nm on an arbitrary surface which is perpendicular to the optical axis of the EUV focusing mirror 5 has a distinct distribution of illuminance in a relatively narrow region around the optical axis, while the radiation outside the band does not have a distinct distribution of the illuminance, but in the region which extends relatively far away from the optical axis, it has a distribution of illuminance.

The measure that the diameter of the circular opening of the aperture component 50 arranged in the above described manner is set according to the spatial distribution of the wavelength which is specific to the radiation which is emitted by the above described EUV radiation source therefore enables selective extraction of the EUV radiation with a wavelength of 13.5 nm from the radiation which is emitted by the EUV radiation source device. The specific numerical values of the opening are described below by way of example.

It is desirable to adjust the size of the aperture component 50, for example, of a plate component to the size at which the radiation emerging from the EUV focusing mirror 5 of the EUV radiation source device can be completely incident. When the size of the aperture component is smaller than the radiation emerging from the EUV focusing mirror, as a result the radiation emerging from the EUV focusing mirror 5 also passes through outside of the opening of the aperture component 50; this causes the above described deterioration of the exposure performance.

The aperture component 50 is held by the aperture component driving device 51 (FIG. 5) such that it can be driven in any direction in a plane perpendicular to the optical axis of the EUV focusing mirror 5. The radiation source control element 14 or the exposure machine control element 41 controls the aperture driving control element 52 and drives the aperture component driving device 51 such that the opening 50a of the aperture component 50 is positioned at a predefined point.

By the arrangement of the aperture component driving device 51 in the above described manner, the aperture component 50 can be easily aligned and the EUV radiation with a wavelength of 13.5 nm can be effectively extracted.

Because the size of the aperture component 50 as compared to the region on the radiation incidence side of the aperture component 50 which is irradiated with radiation emerging from the EUV focusing mirror 5 is set to be rather large, it becomes possible to also use the aperture component 50 as an optical shutter.

That is, by the measure that the size of the radiation shielding region as the region outside the opening of the aperture component 50 is made larger than the area of the radiation incidence surface of the aperture component 50 which is irradiated with radiation emerging from the EUV focusing mirror, the above described radiation shielding area can be used as a shutter.

In the case of shielding the EUV radiation by the aperture component 50 the aperture driving control element 52 by means of the aperture component driving device 51 moves the aperture component 50 in the direction perpendicular to the optical axis of the EUV focusing mirror 5. The radiation emerging from the EUV focusing mirror 5 is shielded by the above described radiation shielding area of the aperture component 50.

In FIG. 5, the aperture component 50 is located within the EUV radiation source device 10. However, the aperture component 50 can also be located within the frame 21 of the exposure machine 20.

Figure 7:
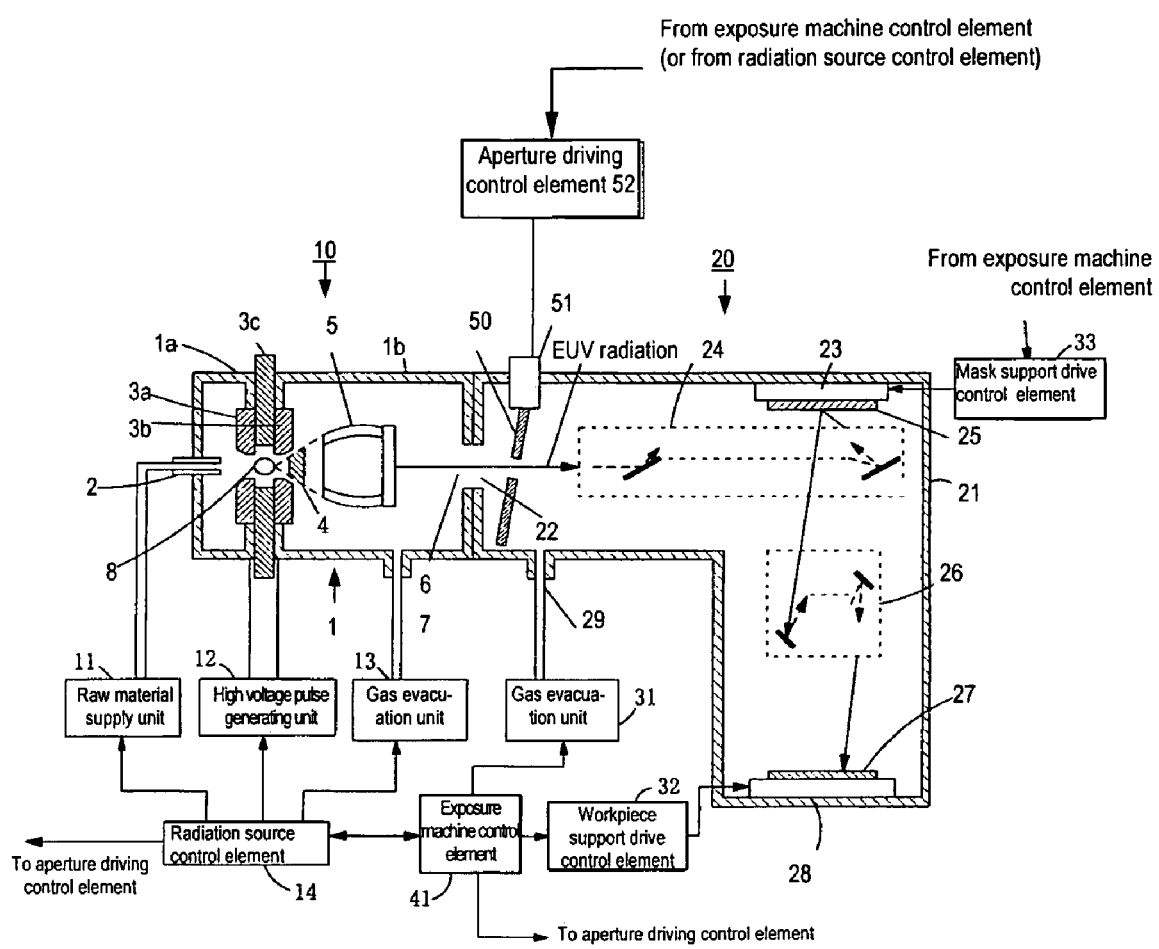
FIG. 7 is a schematic of the arrangement of another embodiment of the EUV exposure tool according to the invention.

FIG. 7 shows the arrangement of an example of an arrangement of the aperture component 50 in the frame 21 of the exposure machine 20. In FIG. 7, the same elements as in FIG. 5 are provided with the same reference numbers as in FIG. 5. Besides the fact that the aperture component 50 and the aperture component driving device 51 are located within the exposure machine frame 21, the remaining arrangement and operation of the FIG. 7 arrangement are identical to that of the FIG. 5 arrangement.

As is shown in FIG. 7, the aperture component driving device 51 is located on the exposure machine frame 21 when the aperture component 50 is located in the exposure machine frame 21. As was described using FIG. 5, the aperture driving control component 52 executes control by the aperture component driving device 51 such that the opening 50a of the aperture component 50 is located at a predefined point. In the case of using an aperture component 50 as an optical shutter, the aperture component 50 is moved in the direction perpendicular to the optical axis of the EUV focusing mirror 5.

In the case of using an EUV radiation source device as the EUV radiation source device with the function of shielding the radiation outside the band, the aperture component 50 is arranged in the EUV radiation source device as is shown in FIG. 5.

Figure 8:
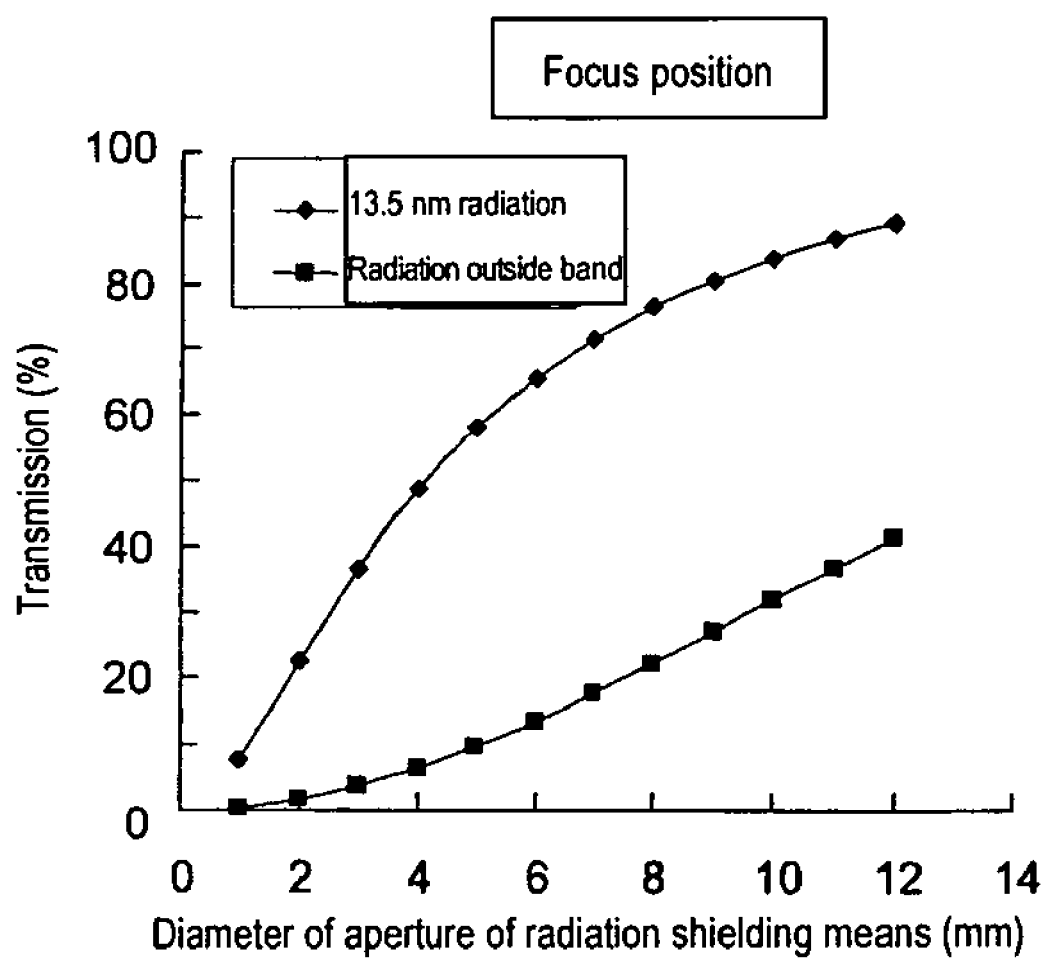
FIG. 8 is a graph depicting relative changes of the transmittance of the EUV radiation and the radiation outside the band in an arrangement of the aperture component on the focal plane of the EUV focusing mirror and when the opening diameter of the aperture component changes.

FIG. 8 shows the relative changes of the transmittance of the EUV radiation with a wavelength of 13.5 nm and the radiation outside the band (in the wavelength range from 140 nm to 4000 nm) in an arrangement of the aperture component 50 on the focal plane (focusing point plane) of the EUV focusing mirror and when the diameter of the openings of the aperture component changes.

In this connection, the aperture component 50 is circular. The middle of the opening 50a is located on the optical axis of the EUV focusing mirror 5. The radiation incidence side of the aperture component 50 is essentially perpendicular to the optical axis of the EUV focusing mirror 5. In FIG. 8, the transmittance of the EUV radiation with a wavelength of 13.5 nm and the transmittance of the radiation outside the band are each designated as 100% in the case in which the aperture component 50 is not present.

As becomes apparent from FIG. 8, when the diameter of the opening is fixed, for example, at 5 mm, the EUV radiation with a wavelength of 13.5 nm is 58% transmitted compared to the case in which there is no aperture, while the radiation outside the band is only 10% transmitted. Therefore, becomes possible to reduce the ratio of the radiation outside the band to the EUV radiation with a wavelength of 13.5 nm to roughly ⅙.

If the diameter of the opening is fixed at 10 mm, the EUV radiation with a wavelength of 13.5 nm is 84% transmitted compared to the case in which there is no aperture, while the radiation outside the band is only 32% transmitted. Therefore, it becomes possible to reduce the ratio of the radiation outside the band to the EUV radiation with a wavelength of 13.5 nm to roughly ¼.

In a case of an arrangement of the aperture component outside the focal plane, by increasing the diameter of the opening according to its position, the same effect can be achieved.

Figure 9:
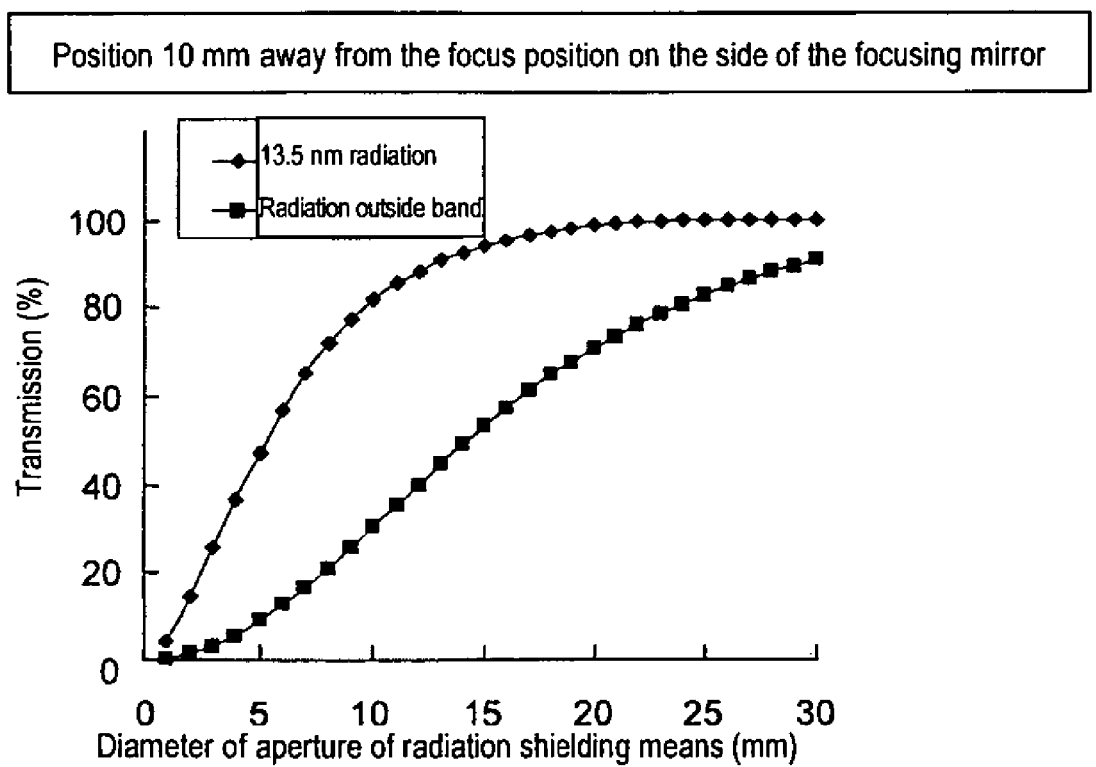
FIG. 9 is a graph depicting relative changes of the transmittance of the EUV radiation and the radiation outside the band in an arrangement of the aperture component at a point which is 10 mm away from the focal plane of the EUV focusing mirror onto the side of the EUV focusing mirror and when the opening diameter of the aperture component changes.
Figure 10:
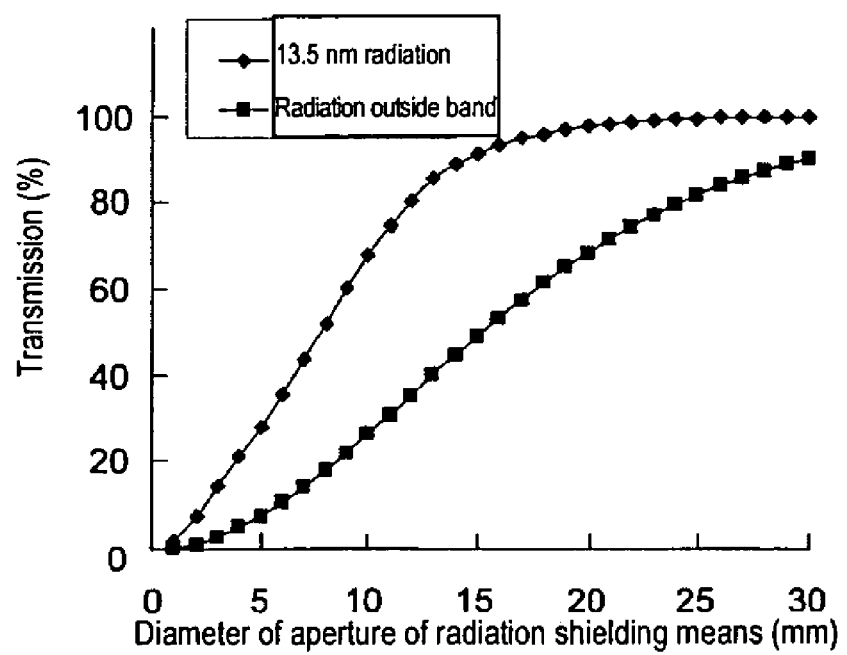
FIG. 10 is a graph depicting relative changes of the transmittance of the EUV radiation and the radiation outside the band in an arrangement of the aperture component at a point which is 20 mm away from the focal plane of the EUV focusing mirror onto the side of the EUV focusing mirror and when the opening diameter of the aperture component changes.

FIG. 9 shows, for example, the relative changes of the transmittance of the EUV radiation with a wavelength of 13.5 mm and the radiation outside the band (in a wavelength range from 140 nm to 4000 nm) for the arrangement of the aperture component 50 at a location which is 10 mm away from the focal plane of the EUV focusing mirror 5 onto the side of the EUV focusing mirror, and when the diameter of the opening of the aperture component 50 changes. FIG. 10 shows the relative changes of the transmittance of the EUV radiation with a wavelength of 13.5 nm and the radiation outside the band (in a wavelength range from 140 nm to 4000 nm) for the arrangement of the aperture component 50 at a location which is 20 mm away from the focal plane of the EUV focusing mirror 5 onto the side of the EUV focusing mirror, and when the diameter of the opening of the aperture component 50 changes.

In FIGS. 9 & 10, the shape of the aperture component 50, the position thereof and the like of the aperture component 50 are identical to those in FIG. 8. This means that the opening of the aperture component 50 is circular. The center of the opening 50a is located on the optical axis of the EUV focusing mirror 5. The radiation incidence side of the aperture component 50 is essentially perpendicular to the optical axis of the EUV focusing mirror.

As is shown in FIG. 9, for the arrangement of the aperture component 50 at a location which is 10 mm away from the focal plane of the EUV focusing mirror 5 onto the side of the EUV focusing mirror, and when the diameter of the opening is fixed at roughly 6 mm, the EUV radiation with a wavelength of 13.5 nm, as in the case as shown in FIG. 8, is 58% transmitted compared to the case in which there is no aperture, while the radiation outside the band is roughly 13% passed.

Likewise, as is shown in FIG. 10, for the arrangement of the aperture component 50 at a location which is 20 mm away from the focal plane of the EUV focusing mirror 5 onto the side of the EUV focusing mirror, and when the diameter of the opening is fixed at roughly 8.5 mm, the EUV radiation with a wavelength of 13.5 nm, as in the case as shown in FIG. 8, is 58% transmitted compared to the case in which there is no aperture 50, while the radiation outside the band is roughly 21% transmitted.

As the results shown in FIGS. 9 & 10 indicate, it was found that, in the case of arranging the aperture component 50 outside the focal plane, by increasing the diameter of the opening according to its position, the same effect can be achieved.

In the results shown in FIGS. 8-10, the transmittance of the radiation outside the band is 10%, 13%, and 21% (therefore, not the same value) when the diameter of the opening has been fixed at 5 mm, 6 mm and 8.5 mm but the transmittance of the EUV radiation with a wavelength of 13.5 nm at the point at which the respective aperture is located has the same value of 58%.

It can be imagined that the reason for this is that the spatial distribution of the wavelength of the radiation emitted from the EUV radiation source device in the optical axis direction does not always behave uniformly (similarly).

As a result of tests and research, it was found that, for an arrangement of the aperture component 50 on the focal plane of the EUV focusing mirror 5 or in the vicinity of the focal plane of the EUV focusing mirror 5, wavelength selection of the radiation emitted by the EUV radiation source device can be most effectively carried out. In the above described examples, the ratio of the radiation outside the band to the EUV radiation with a wavelength of 13.5 nm is roughly ⅙, when the aperture component 50 is located on the focal plane of the EUV focusing mirror 5, furthermore roughly 1/(4.5) when the aperture component 50 is 10 mm away from the focal plane of the EUV focusing mirror 5 onto the side of the EUV focusing mirror, and roughly ⅓ when the aperture component 50 is 20 mm away from the focal plane of the EUV focusing mirror 5 onto the side of the EUV focusing mirror 5. Therefore, it was confirmed that the above described wavelength selection is most effectively carried out when the aperture component 50 is located on the focal plane of the EUV focusing mirror 5.

When the aperture component 50 is arranged such that the opening 50a of the aperture component 50 is at the focusing point by means of the EUV focusing mirror 5 or in the vicinity of the focusing point, the region on the radiation incidence side of the aperture component 50 which is irradiated by the radiation which emerges from the EUV focusing mirror 5 is made smaller. Thus, it becomes possible also to reduce the size of the aperture component 50.

As was described above, in accordance with the invention, using the spatial distribution of wavelength as a specific property of the radiation emitted from the extreme UV radiation source device, by inserting the aperture component as a radiation shielding means provided with an opening in the optical path, the EUV radiation with a wavelength of 13.5 nm is selectively extracted from the radiation emitted from the EUV radiation source device.

In the case of using a Zr thin layer filter as the wavelength selection means, the transmittance of the EUV radiation with a wavelength of 13.5 nm at a layer thickness, for example, of 200 nm is roughly 50%, by which the usable intensity of the EUV radiation with a wavelength of 13.5 nm is reduced. Due to the brittle layer structure, it must be treated carefully. The holding arrangement within the device becomes complicated due to the brittle thin layer structure.

The use of a diffraction grating as the wavelength selection means, as was described above, causes a considerable reduction in the intensity of the EUV radiation with a wavelength of 13.5 nm which is extracted by the wavelength selection means. With consideration of the intensity of the EUV radiation necessary for exposure, therefore it is not practical. Even if it were to be used, an increase in the size of the device would be caused due to the large space for arrangement of the diffraction grating within the device.

On the other hand, in the case of the aperture arrangement of the invention, by fixing the diameter of the opening to a predefined opening, it became possible to effectively subject the radiation emitted by the EUV radiation source device to wavelength selection, thus to extract EUV radiation with a wavelength of 13.5 nm and to eliminate the radiation outside the band which has adverse effects on exposure without reducing the power of the EUV radiation with a wavelength of 13.5 nm as the exposure radiation.

Since the aperture component comprises a plate component made of a metal with a high melting point or of a ceramic material, the aperture component arrangement is relatively durable. Its handling is simplified and the holding arrangement within the device does not become complicated either. Since a plate component is used, only a small space is required for the arrangement. Therefore, an increase in the size of the device is not caused.

As was described above, it is advantageous to arrange the aperture-component at the focusing point of the EUV focusing mirror or in the vicinity of its focusing point. However, the radiation emitted from the EUV radiation source device at the focusing point or in the vicinity of the focusing point has a high energy density. The aperture component on which this radiation with a high energy density is incident has a large thermal loading in the shielding area of the aperture component. Even if the aperture component is made of, for example, a high melting point metal, such as tungsten, molybdenum, tantalum or the like, it is possible for thermal deformation to occur.

Accordingly, in the area of the aperture component 50 there can also be a cooling means. FIGS. 11(a) & 11(b) show an example of an arrangement of a water-cooled tube of the cooling means. FIG. 11(a) is a schematic in which the aperture component was viewed from the side which is opposite the radiation incidence side. FIG. 11(b) is a cross section taken along line A-A as shown in FIG. 11(a).

In order to avoid the disadvantages of direct heating of the water-cooled tube itself by the radiation emitted from the EUV radiation source device and of nonuniform reflection of the irradiation by the water-cooled tube, a water-cooled tube 50b, as is shown in the drawings, is located on the surface opposite the radiation incidence side of the aperture component 50 and is attached to the aperture component 50 by soldering or the like.

The cooling water is supplied to the cooling tube and the cooling water is drained out by a cooling water supply and drain means (not shown). The cooling water supplied to the cooling tube during flow in the water-cooled tube 50b is subjected to heat exchange with the aperture component 50 via the water-cooled tube 50b. It is desirable to arrange the water-cooled tube 50b in the vicinity of the opening of the aperture component 50 in which the thermal loading is especially great, as shown in FIGS. 11(a) & 11(b).

FIGS. 12(a) & 12(b) show the arrangement of another example of the aperture component. FIG. 12(a) is a schematic in which the aperture component was viewed from the radiation incidence side. FIG. 12(b) is a cross section taken along line A-A shown in FIG. 12(a).

The aperture component 50, in this embodiment, is formed of several plate components 50c which have openings 50a. The plate components 50c are attached to one another by supports 50d with a predefined distance between them. The supports 50d are located, for example, at four locations. The respective plate component 50c is attached to the supports 50d by soldering or the like.

The size of the opening 50a of the respective plate component 50c is established such that it decreases in the optical axis direction of the EUV focusing mirror 5 according to the advancing direction of the radiation emitted by the EUV radiation source device. The size of the smallest opening is established according to the spatial distribution of wavelength which is specific to the radiation emitted by the EUV radiation source. When the radiation emitted by the EUV radiation source passes through the smallest opening, the desired wavelength is selected.

Since the size of the opening 50a of the respective plate component 50c is reduced in steps especially along the advancing direction of the radiation, as is shown in FIGS. 12(a) & 12(b), it becomes possible for the thermal loading to be shared by several plate components 50c. Thus, the disadvantage of thermal deformation of the aperture component 50 means can be avoided.

Each of the plate components 50c is made, for example, of a metal with a high melting point, such as tungsten, molybdenum, tantalum or the like, or of a ceramic. All plate components can be produced from a metal with a high melting point or all can also be produced from a ceramic. However, the plate components can also be produced in part from a metal with a high melting point with the remainder from a ceramic. Furthermore, the cooling means shown, for example in FIGS. 11(a) & 11(b) do need not be located on all of the plate components 50c.

In the above described embodiment, the case of arranging the aperture component 50 as a plate component in the EUV radiation source device 10 or in the exposure machine 20 was described. However, the same effect can also be obtained by the arrangement of the radiation exit part 6 of the EUV radiation source device 10 or the radiation incidence part 22 of the exposure machine 20 such that it also acts as an aperture component 50.

The size of the opening of the radiation exit part 6 or of the radiation incidence part 22 in this case, as in the case of an aperture component 50 of a plate component, is fixed according to the spatial distribution of wavelength which is specific to the radiation emitted by the EUV radiation source device 10 such that essentially only extreme UV radiation is transmitted.

The EUV radiation source device 10 and the exposure machine 20, as was described above, are evacuated by gas evacuation units 13, 31. However, there is a pressure difference between the EUV radiation source device 10 and the exposure machine 20. Therefore, it is desirable to reduce the diameter of the opening of the above described radiation exit part 6 or of the above described radiation incidence part 22 as much as possible in order to separate the EUV radiation source device 10 from the exposure machine 20.

Therefore, it can be imagined that it is desirable to arrange the radiation exit part 6 and the radiation incidence part 22 in the vicinity of the focal position of the EUV focusing mirror 5. The arrangement of the radiation exit part 6 or of the radiation incidence part 22 such that it also acts as an aperture 50 is relatively simple. The arrangement can also be simplified by such a measure.

Furthermore, the position of the radiation exit part 6 or of the radiation incidence part 22 if necessary can be inclined to a certain degree in the direction perpendicular to the optical axis of the EUV focusing mirror in the manner shown in FIG. 5 to prevent the radiation reflected from the surface of the radiation exit part 6 or of the radiation incidence part 22 which acts as an aperture from being focused, for example, on an unwanted location in the chamber of the EUV radiation source device.

One example of adjusting the arrangement position of the aperture component is described below using FIG. 5 and the flow chart shown in FIG. 13.

Figure 13:
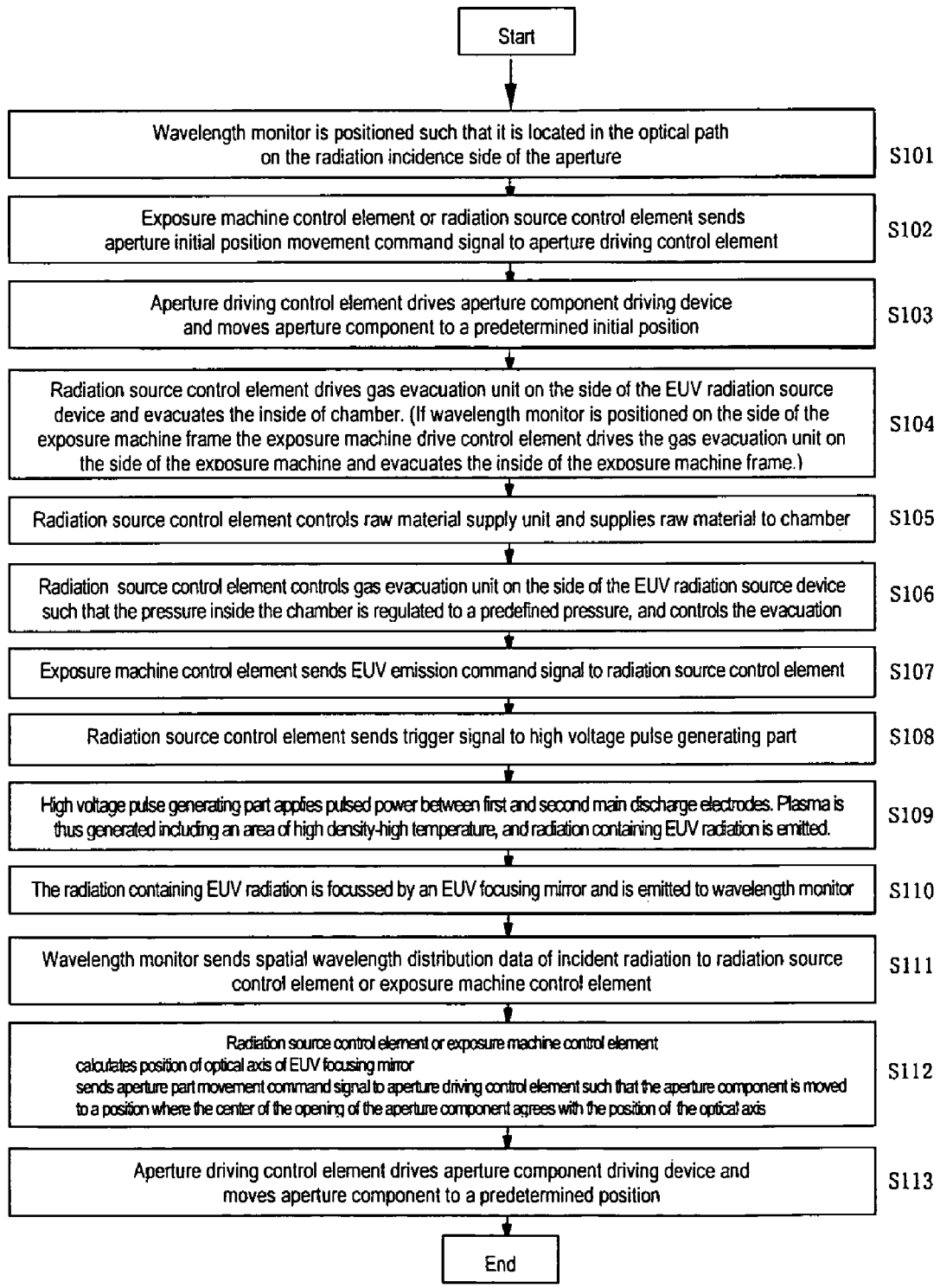
FIG. 13 is a flow chart which shows the sequence of the positioning control of the aperture compartment.

An EUV radiation distribution monitor (not shown) is subjected to position adjustment such that it is located in the optical path on the radiation exit side of the aperture component 50 (step S101 as shown in FIG. 13). The position of the EUV radiation distribution monitor is adjusted by a driving control device (not shown). Position adjustment is performed based on a movement command from the exposure machine control element 41 or a radiation source control element 14. In this connection, the EUV radiation distribution monitor can be located in the chamber of the EUV radiation source device 10 or in the exposure machine frame 21. One example is described below in which the EUV radiation distribution monitor is located in the optical path only during position adjustment of the arrangement position of the aperture component.

In an arrangement in which the radiation emerging from the aperture component 50 is sampled in part by means of a reflector or the like, and is incident in the EUV radiation distribution monitor, position adjustment of the EUV radiation distribution monitor need be performed only once.

In an arrangement of the aperture component 50 on the side of the EUV radiation source device 10, the arrangement position of the aperture component can also be adjusted before connecting the EUV radiation source device 10 to the exposure machine 20. In this case, the EUV radiation distribution monitor can also be located outside the EUV radiation source device 10 only in an adjustment of the arrangement position of the aperture component.

The exposure machine control element 41 or the radiation source control element 14 sends an aperture initial position movement command signal to the aperture driving control element 52 (step S102). The aperture driving control element 52 which receives this signal drives the aperture component driving device 51 and moves the aperture component 50 to a predetermined given initial position (step S103) which is, for example, a point which deviates from the optical path through which the radiation which has been emitted by the above described plasma passes.

The radiation source control element 14 drives the gas evacuation unit 13 on the side of the EUV radiation source device 10 and evacuates the inside of the chamber 1. On the other hand, the exposure machine control element 41 drives the gas evacuation unit 31 on the side of the exposure machine 20 when the EUV radiation distribution monitor is located on the side of the exposure machine frame 21 and thus the inside of the exposure machine fame is evacuated (step S104).

The radiation source control element 14 controls the raw material supply unit 11 and supplies raw material to the chamber 1. In the case, for example, in which the raw material is SnH$_4$ gas, the raw material supply unit 11 adjusts the flow rate of the SnH$_4$ gas supplied to the chamber 1 to a given value (step S105).

Based on the pressure data which are sent from a pressure monitor (not shown) and which monitors the pressure within the chamber, the radiation source control element 14 controls the gas evacuation unit 13 on the side of the EUV radiation source device 10 such that the pressure in the chamber 1 is a defined pressure (for example, 1 Pa to 20 Pa) and controls the amount of gas evacuated (step S106).

The exposure machine control element 41 sends an EUV emission command signal to the radiation source control element 14 (step S107).

The radiation source control element which has received the EUV emission command signal sends a trigger signal to the high voltage pulse generating part 12 (step S108).

The high voltage pulse generating part 12 which has received the trigger signal applies pulsed power between the first main discharge electrode (cathode) 3a and the second main discharge electrode (anode) 3b.

On the surface of the insulating material 3c, a creeping discharge forms, by which, between the first and the second main discharge electrodes 3a, 3b, essentially a short circuit state arises, a pulse-like large current flows and a plasma is formed. Afterwards, an area of high density and high temperature plasma is formed by Joulean heating by the pinch effect in the above described plasma. From the plasma comprising this area of a high density and high temperature plasma, EUV radiation with a wavelength of 13.5 nm and radiation outside the band are radiated (step S109).

EUV radiation with a wavelength of 13.5 nm which has been emitted by the plasma and the radiation outside the band which has been emitted by the plasma are reflected/focused by an EUV focusing mirror 5 which is located on the side of the second main discharge electrode 3b (anode) and emerges into the EUV radiation distribution monitor (step S110).

The EUV radiation distribution monitor, for example, monitors the distribution of the EUV radiation intensity in the two-dimensional direction and sends the distribution data of the two-dimensional intensity of the incident EUV radiation to the radiation source control element 14 or the exposure machine control element 41 (step S111).

The radiation source control element 14 or the exposure machine control element 41 which has received the distribution data of the two-dimensional intensity determines the middle of the region in which there is a distribution of the EUV radiation with a wavelength of 13.5 nm (that is, the position of the optical axis of the EUV focusing mirror 5) and sends an aperture movement command signal to the aperture driving control element 52 such that the aperture component 50 is moved to the position at which the middle of the opening of the aperture component 50 agrees with the above described position of the optical axis (step S112). The aperture driving control element 52 which has received the aperture movement command signal drives the aperture component driving device 51 and moves the aperture component 50 to the above described position (step S113). In this way, the arrangement position of the aperture component is adjusted.

A case of using an EUV radiation source device of the DPP type as an EUV radiation source device was described above by way of example. But, as was described above, the same action can also be obtained using an EUV radiation source device of the LPP type.

I claim:

1. Extreme UV radiation exposure tool which comprises: an extreme UV radiation source device having:

means for producing a plasma, which surrounds a high density and high temperature region essentially in a middle area thereof which emits extreme UV radiation, by heating and excitation of a supplied raw material;

an optical focusing means for focusing radiation with a spatial distribution of wavelength which has been emitted from the said plasma, said radiation being formed of extreme UV radiation emitted from the high density and high temperature region of the plasma and of radiation emitted from an area outside the high density and high temperature region of said plasma; and a radiation exit part for extracting the focused radiation, and a mask in which a pattern is formed;

an illumination optical system which comprises at least one optical element and which projects radiation which contains the radiation extracted from the radiation exit part of the above described extreme UV radiation source device onto the mask;

a projection optical system which projects the radiation from the mask onto a workpiece, and a radiation shielding means provided with an opening for transmitting only a portion of the radiation extracted by the radiation exit part, the radiation shielding means being positioned so that the opening is able to effectively eliminate radiation outside of a band which has adverse effects on exposure without reducing the intensity of extreme UV radiation with a wavelength of 13.5 nm with the middle of the opening being located on the optical axis of the optical focusing means in an area of an optical path between the optical focusing means of the above-described extreme UV radiation source device and an optical element of the illumination optical system in which the radiation from the radiation exit part of the extreme UV radiation source device is first incident.

2. Extreme UV radiation exposure tool as claimed in claim 1, wherein a radiation incidence side of the radiation shielding means is large enough for the radiation which has been extracted by the radiation exit part to be completely incident on it, and wherein the opening of the radiation shielding means and its position are such that, of the radiation with a spatial distribution of wavelength incident on the radiation shielding means, essentially only extreme UV radiation is transmitted through the opening of the radiation shielding means.

3. Extreme UV radiation exposure tool as claimed in claim 1, wherein the radiation shielding means comprises at least one plate component with an opening.

4. Extreme UV radiation exposure tool as claimed in claim 3, wherein the radiation shielding means comprises a plurality of plate components that are spaced apart from one another, each of the plate components having an opening, and the openings of the plate components becoming smaller with increasing distance from the radiation exit part, the size of the smallest opening being such that, of the radiation with a spatial distribution of wavelength incident in the radiation shielding means, essentially only extreme UV radiation is transmitted.

5. Extreme UV radiation exposure tool as claimed in claim 1, wherein the radiation shielding means is located in the vicinity of a focusing point of the radiation which has been extracted by the radiation exit part and which has been focused by the optical focusing means.

6. Extreme UV radiation exposure tool as claimed in claim 1, wherein the radiation shielding means is made of at least one of a metallic material with a high melting point and a ceramic material.

7. Extreme UV radiation exposure tool as claimed in claim 1, further comprising a cooling means for cooling of the radiation shielding means, the cooling means being located at least in a vicinity of the opening of the radiation shielding means.

8. Extreme UV radiation exposure tool as claimed in claim 1, wherein the radiation shielding means is movable.

9. Extreme UV radiation exposure tool as claimed in claim 8, wherein the radiation shielding means is movable to a position at which the radiation which has been focused by the optical focusing means and which contains extreme UV radiation is projected completely on an area of the above described radiation shielding means which does not have an opening in order to act as a shutter.

10. Extreme UV radiation exposure tool as claimed in claim 1, wherein the means for producing a plasma of the extreme UV radiation source device has a pair of discharge electrodes for producing said plasma.

11. Extreme UV radiation exposure tool as claimed in claim 1, wherein the means for producing a plasma of the extreme UV radiation source device has a laser radiation irradiation means for producing said plasma.

12. Extreme UV radiation source device which comprises the following:

means for producing a plasma, which surrounds a high density and high temperature region essentially in a middle area thereof which emits extreme UV radiation, by at least one of heating and excitation of a supplied raw material;

an optical focusing means for focusing radiation with a spatial distribution of wavelength which has been emitted from the said plasma, said radiation being formed of extreme UV radiation emitted from the high density and high temperature region of the plasma and of radiation emitted from an area outside the high density and high temperature region of said plasma; and a radiation exit part for extracting the focused radiation, and a radiation shielding means provided with an opening for transmitting only a portion of the radiation extracted by the radiation exit part, the radiation shielding means being positioned so that the opening is able to effectively eliminate radiation outside of a band which has adverse effects on exposure without reducing the intensity of extreme UV radiation with a wavelength of 13.5 nm with the middle of the opening being located on the optical axis of the optical focusing means in an area of an optical path between the optical focusing means and the radiation exit part.

13. Extreme UV radiation source device as claimed in claim 12, wherein a radiation incidence side of the radiation shielding means is large enough for the radiation which has been extracted by the radiation exit part to be completely incident on it, and wherein the opening of the radiation shielding means and its position are such that, of the radiation with a spatial distribution of wavelength incident on the radiation shielding means, essentially only extreme UV radiation is transmitted through the opening of the radiation shielding means.

14. Extreme UV radiation exposure source device as claimed in claim 12, wherein the radiation shielding means comprises a plurality plate components that are spaced apart from one another, each of the plate components having an opening, and the openings of the plate components becoming smaller with increasing distance from the radiation exit part, the size of the smallest opening being such that, of the radiation with a spatial distribution of wavelength incident in the radiation shielding means, essentially only extreme UV radiation is transmitted.

15. Extreme UV radiation exposure source device as claimed in claim 12, wherein the radiation shielding means is located in the vicinity of a focusing point of the radiation which has been extracted by the radiation exit part and which has been focused by the optical focusing means.

16. Extreme UV radiation exposure source device as claimed in claim 12, wherein the radiation shielding means is made of at least one of a metallic material with a high melting point and a ceramic material.

17. Extreme UV radiation exposure source device as claimed in claim 12, further comprising a cooling means for cooling of the radiation shielding means, the cooling means being located at least in a vicinity of the opening of the radiation shielding means.

18. Extreme UV radiation exposure source device as claimed in claim 12, wherein the radiation shielding means is movable.

19. Extreme UV radiation exposure source device as claimed in claim 18, wherein the radiation shielding means is movable to a position at which the radiation which has been focused by the optical focusing means and which contains extreme UV radiation is projected completely on an area of the above described radiation shielding means which does not have an opening in order to act as a shutter.

20. Extreme UV radiation exposure source device as claimed in claim 12, wherein the radiation shielding means is inclined relative to a direction perpendicular to the optical axis of the optical focusing means.

* * * * *